United States Patent [19]
Nakazawa

[11] Patent Number: 6,150,888
[45] Date of Patent: Nov. 21, 2000

[54] PHASE LOCKED LOOP CIRCUIT, REPRODUCTION APPARATUS AND PHASE LOCKING METHOD

[75] Inventor: Tetsuji Nakazawa, Kanagawa, Japan

[73] Assignee: Sony Corporation, Tokyo, Japan

[21] Appl. No.: 09/193,112

[22] Filed: Nov. 16, 1998

[30] Foreign Application Priority Data

Nov. 19, 1997 [JP] Japan ..................................... 9-318491

[51] Int. Cl.⁷ ....................................................... H03L 7/07
[52] U.S. Cl. .............................. 331/11; 369/48; 369/50; 369/59
[58] Field of Search .............................. 360/51; 331/1 A, 331/11; 369/48, 50, 59

[56] References Cited

U.S. PATENT DOCUMENTS 4,908,810  3/1990  Oie ............................................. 369/50

FOREIGN PATENT DOCUMENTS

0558261 A1  9/1993  European Pat. Off. .......... H02P 6/02
0714096 A1  5/1996  European Pat. Off. ........ G11B 19/20
0805438 A2  11/1997  European Pat. Off. .......... G11B 7/00

*Primary Examiner*—Robert Pascal
*Assistant Examiner*—Kimberly Glenn
*Attorney, Agent, or Firm*—Limbach & Limbach L.L.P.

[57] ABSTRACT

The invention provides a phase locked loop circuit, a reproduction apparatus and a phase locking method by which a capture range and a lock range can be widened. Before a phase locked loop circuit is locked, an output clock of a voltage controlled oscillator is counted with reference to a reference clock of a quartz oscillator, and an error component between run length limited codes reproduced from a disk and the reference clock is extracted. Then, the PLL circuit is constructed based on a result of addition of the counted value of the output clock and the extracted error component. After the phase locked loop circuit is locked, a phase error of the output clock of the voltage controlled oscillator against the run length limited codes reproduced from the disk is detected, and the PLL circuit is constructed based on the detected phase error.

30 Claims, 18 Drawing Sheets

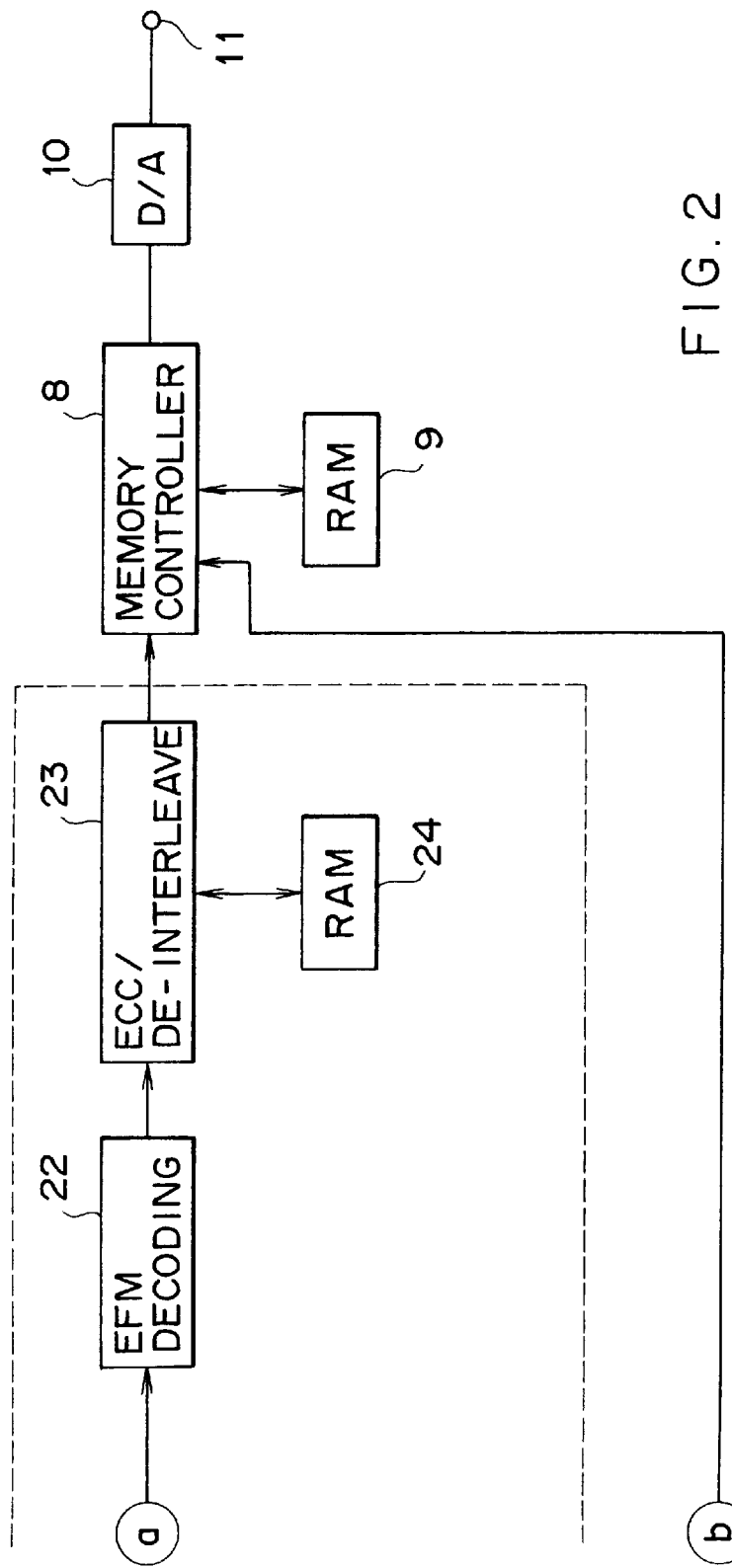

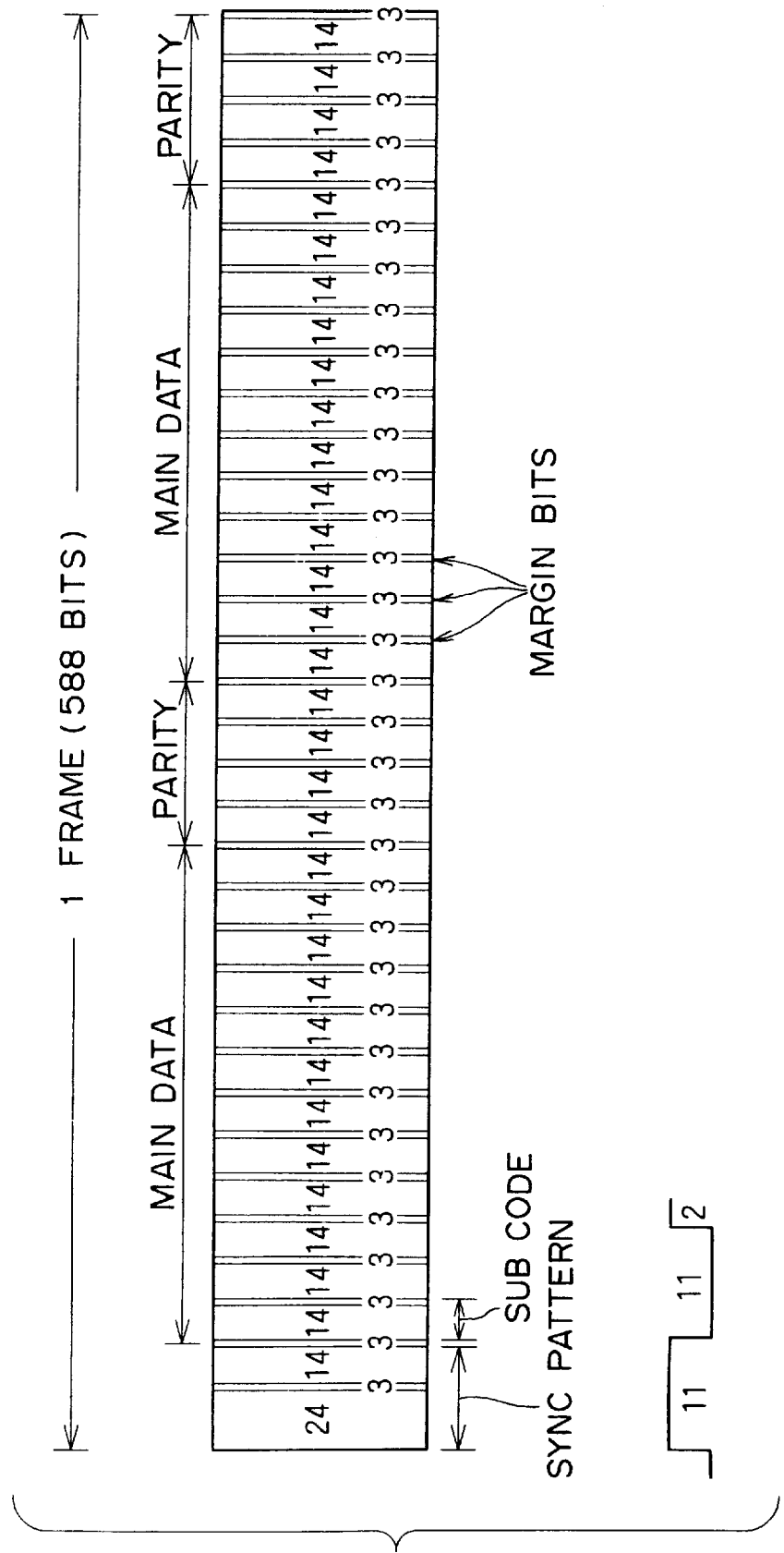

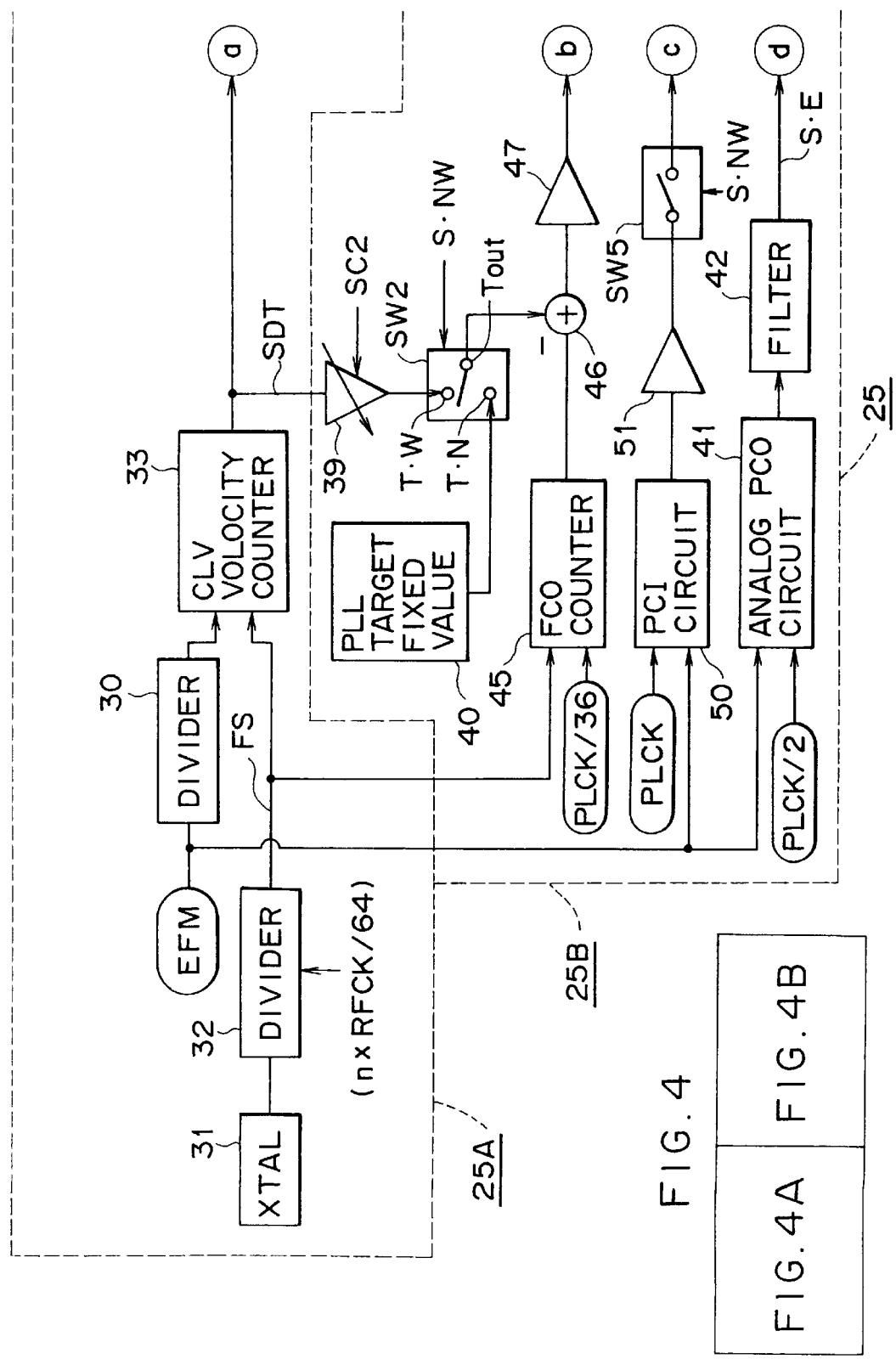

FIG. 5

| DATA | EFM DATA | REVERSAL NUMBER | DATA | EFM DATA | REVERSAL NUMBER |
|------|----------|-----------------|------|----------|-----------------|
| 0 | 01001000100000 | 3 | 20 | 00000000100000 | 1 |
| 1 | 10000100000000 | 2 | 21 | 10000100001000 | 3 |
| 2 | 10010000100000 | 3 | 22 | 00001000100000 | 2 |
| 3 | 10001000100000 | 3 | 23 | 00100100100000 | 3 |
| 4 | 01000100000000 | 2 | 24 | 01000100001000 | 3 |
| 5 | 00000100010000 | 2 | 25 | 00000100001000 | 2 |
| 6 | 00010000100000 | 2 | 26 | 01000000100000 | 2 |
| 7 | 00100100000000 | 2 | 27 | 00100100001000 | 3 |
| 8 | 01001001000000 | 3 | 28 | 01001001001000 | 4 |
| 9 | 10000001000000 | 2 | 29 | 10000001001000 | 3 |
| A | 10010001000000 | 3 | 2A | 10010001001000 | 4 |
| B | 10001001000000 | 3 | 2B | 10001001001000 | 4 |
| C | 01000001000000 | 2 | 2C | 01000001001000 | 3 |
| D | 00000001000000 | 1 | 2D | 00000001001000 | 2 |
| E | 00010001000000 | 2 | 2E | 00010001001000 | 3 |
| F | 00100001000000 | 2 | 2F | 00100001001000 | 3 |
| 10 | 10000000100000 | 2 | 30 | 00000100000000 | 1 |
| 11 | 10000010000000 | 2 | 31 | 10000010001000 | 3 |
| 12 | 10010010000000 | 3 | 32 | 10010010001000 | 4 |
| 13 | 00100000100000 | 2 | 33 | 10000100010000 | 3 |
| 14 | 01000010000000 | 2 | 34 | 01000010001000 | 3 |
| 15 | 00000010000000 | 1 | 35 | 00000010001000 | 2 |
| 16 | 00010010000000 | 2 | 36 | 00010010001000 | 3 |
| 17 | 00100010000000 | 2 | 37 | 00100010001000 | 3 |
| 18 | 01001000010000 | 3 | 38 | 01001000001000 | 3 |
| 19 | 10000000010000 | 2 | 39 | 10000000001000 | 2 |
| 1A | 10010000010000 | 3 | 3A | 10010000001000 | 3 |
| 1B | 10001000010000 | 3 | 3B | 10001000001000 | 3 |
| 1C | 01000000010000 | 2 | 3C | 01000000001000 | 2 |
| 1D | 00001000010000 | 2 | 3D | 00001000001000 | 2 |
| 1E | 00010000010000 | 2 | 3E | 00010000001000 | 2 |
| 1F | 00100000010000 | 2 | 3F | 00100000001000 | 2 |

FIG. 6

| DATA | EFM DATA | REVERSAL NUMBER | DATA | EFM DATA | REVERSAL NUMBER |
|---|---|---|---|---|---|
| 40 | 01001000100100 | 4 | 60 | 01001000100010 | 4 |
| 41 | 10000100100100 | 4 | 61 | 10000100100010 | 4 |
| 42 | 10010000100100 | 4 | 62 | 10010000100010 | 4 |
| 43 | 10001000100100 | 4 | 63 | 10001000100010 | 4 |
| 44 | 01000100100100 | 4 | 64 | 01000100100010 | 4 |
| 45 | 00000000100100 | 2 | 65 | 00000000100010 | 2 |
| 46 | 00010000100100 | 3 | 66 | 01000000100100 | 3 |
| 47 | 00100100100100 | 4 | 67 | 00100100100010 | 4 |
| 48 | 01001001000100 | 4 | 68 | 01001001000010 | 4 |
| 49 | 10000001000100 | 3 | 69 | 10000001000010 | 3 |
| 4A | 10010001000100 | 4 | 6A | 10010001000010 | 4 |
| 4B | 10001001000100 | 4 | 6B | 10001001000010 | 4 |
| 4C | 01000001000100 | 3 | 6C | 01000001000010 | 3 |
| 4D | 00000001000100 | 2 | 6D | 00000001000010 | 2 |
| 4E | 00010001000100 | 3 | 6E | 00010001000010 | 3 |
| 4F | 00100001000100 | 3 | 6F | 00100001000010 | 3 |
| 50 | 10000000100100 | 3 | 70 | 10000000100010 | 3 |
| 51 | 10000010000100 | 3 | 71 | 10000010000010 | 3 |
| 52 | 10010010000100 | 4 | 72 | 10010010000010 | 4 |
| 53 | 00100000100100 | 3 | 73 | 00100000100010 | 3 |
| 54 | 01000010000100 | 3 | 74 | 01000010000010 | 3 |
| 55 | 00000010000100 | 2 | 75 | 00000010000010 | 2 |
| 56 | 00010010000100 | 3 | 76 | 00010010000010 | 3 |
| 57 | 00100010000100 | 3 | 77 | 00100010000010 | 3 |
| 58 | 01001000000100 | 3 | 78 | 01001000000010 | 3 |
| 59 | 10000000000100 | 2 | 79 | 00001001001000 | 3 |
| 5A | 10010000000100 | 3 | 7A | 10010000000010 | 3 |
| 5B | 10001000000100 | 3 | 7B | 10001000000010 | 3 |
| 5C | 01000000000100 | 2 | 7C | 01000000000010 | 2 |
| 5D | 00001000000100 | 2 | 7D | 00001000000010 | 2 |
| 5E | 00010000000100 | 2 | 7E | 00010000000010 | 2 |
| 5F | 00100000000100 | 2 | 7F | 00100000000010 | 2 |

FIG. 7

| DATA | EFM DATA | REVERSAL NUMBER | DATA | EFM DATA | REVERSAL NUMBER |
|---|---|---|---|---|---|
| 80 | 01001000100001 | 4 | A0 | 00001000100001 | 3 |
| 81 | 10000100100001 | 4 | A1 | 10000100001001 | 4 |
| 82 | 10010000100001 | 4 | A2 | 01000100010000 | 3 |
| 83 | 10001000100001 | 4 | A3 | 00000100100001 | 3 |
| 84 | 01000100100001 | 4 | A4 | 01000100001001 | 4 |
| 85 | 00000000100001 | 2 | A5 | 00000100001001 | 3 |
| 86 | 00010000100001 | 3 | A6 | 01000000100001 | 3 |
| 87 | 00100100100001 | 4 | A7 | 00100100001001 | 4 |
| 88 | 01001001000001 | 4 | A8 | 01001001001001 | 5 |
| 89 | 10000001000001 | 3 | A9 | 10000001001001 | 4 |
| 8A | 10010001000001 | 4 | AA | 10010001001001 | 5 |
| 8B | 10001001000001 | 4 | AB | 10001001001001 | 5 |
| 8C | 01000001000001 | 3 | AC | 01000001001001 | 4 |
| 8D | 00000001000001 | 2 | AD | 00000001001001 | 3 |
| 8E | 00010001000001 | 3 | AE | 00010001001001 | 4 |
| 8F | 00100001000001 | 3 | AF | 00100001001001 | 4 |
| 90 | 10000000100001 | 3 | B0 | 00000100100000 | 2 |
| 91 | 10000010000001 | 3 | B1 | 10000010001001 | 4 |
| 92 | 10010010000001 | 4 | B2 | 10010010001001 | 5 |
| 93 | 00100000100001 | 3 | B3 | 00100100010000 | 3 |
| 94 | 01000010000001 | 3 | B4 | 01000010001001 | 4 |
| 95 | 00000010000001 | 2 | B5 | 00000010001001 | 3 |
| 96 | 00010010000001 | 3 | B6 | 00010010001001 | 4 |
| 97 | 00100010000001 | 3 | B7 | 00100010001001 | 4 |
| 98 | 01001000000001 | 3 | B8 | 01001000001001 | 4 |
| 99 | 10000010010000 | 3 | B9 | 10000000001001 | 3 |
| 9A | 10010000000001 | 3 | BA | 10010000001001 | 4 |
| 9B | 10001000000001 | 3 | BB | 10001000001001 | 4 |
| 9C | 01000010010000 | 3 | BC | 01000000001001 | 3 |
| 9D | 00001000000001 | 2 | BD | 00001000001001 | 3 |
| 9E | 00010000000001 | 2 | BE | 00010000001001 | 3 |
| 9F | 00100010010000 | 3 | BF | 00100000001001 | 3 |

FIG. 8

| DATA | EFM DATA | REVERSAL NUMBER | DATA | EFM DATA | REVERSAL NUMBER |
|---|---|---|---|---|---|
| C0 | 01000100100000 | 3 | E0 | 01000100000010 | 3 |
| C1 | 10000100010001 | 4 | E1 | 00000100000010 | 2 |
| C2 | 10010010010000 | 4 | E2 | 10000100010010 | 4 |
| C3 | 00001000100100 | 3 | E3 | 00100100000010 | 3 |
| C4 | 01000100010001 | 4 | E4 | 01000100010010 | 4 |
| C5 | 00000100010001 | 3 | E5 | 00000100010010 | 3 |
| C6 | 00010010010000 | 3 | E6 | 01000000100010 | 3 |
| C7 | 00100100010001 | 4 | E7 | 00100100010010 | 4 |
| C8 | 00001001000001 | 3 | E8 | 10000100000010 | 3 |
| C9 | 10000100000001 | 3 | E9 | 10000100000100 | 3 |
| CA | 00001001000100 | 3 | EA | 00001001001001 | 4 |
| CB | 00001001000000 | 2 | EB | 00001001000010 | 3 |
| CC | 01000100000001 | 3 | EC | 01000100000100 | 3 |
| CD | 00000100000001 | 2 | ED | 00000100000100 | 2 |
| CE | 00000010010000 | 2 | EE | 00010000100010 | 3 |
| CF | 00100100000001 | 3 | EF | 00100100000100 | 3 |
| D0 | 00000100100100 | 3 | F0 | 00000100100010 | 3 |
| D1 | 10000010010001 | 4 | F1 | 10000010010010 | 4 |
| D2 | 10010010010001 | 5 | F2 | 10010010010010 | 5 |
| D3 | 10000100100000 | 3 | F3 | 00001000100010 | 3 |
| D4 | 01000010010001 | 4 | F4 | 01000010010010 | 4 |
| D5 | 00000010010001 | 3 | F5 | 00000010010010 | 3 |
| D6 | 00010010010001 | 4 | F6 | 00010010010010 | 4 |
| D7 | 00100010010001 | 4 | F7 | 00100010010010 | 4 |
| D8 | 01001000010001 | 4 | F8 | 01001000010010 | 4 |
| D9 | 10000000010001 | 3 | F9 | 10000000010010 | 3 |
| DA | 10010000010001 | 4 | FA | 10010000010010 | 4 |
| DB | 10001000010001 | 4 | FB | 10001000010010 | 4 |
| DC | 01000000010001 | 3 | FC | 01000000010010 | 3 |
| DD | 00001000010001 | 3 | FD | 00001000010010 | 3 |
| DE | 00010000010001 | 3 | FE | 00010000010010 | 3 |
| DF | 00100000010001 | 3 | FF | 00100000010010 | 3 |

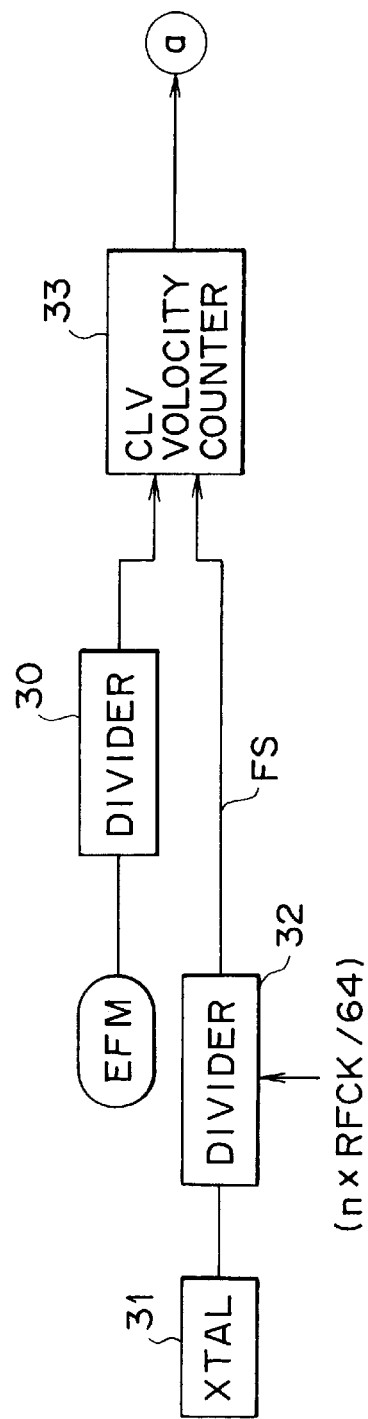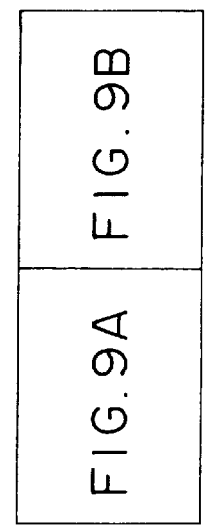

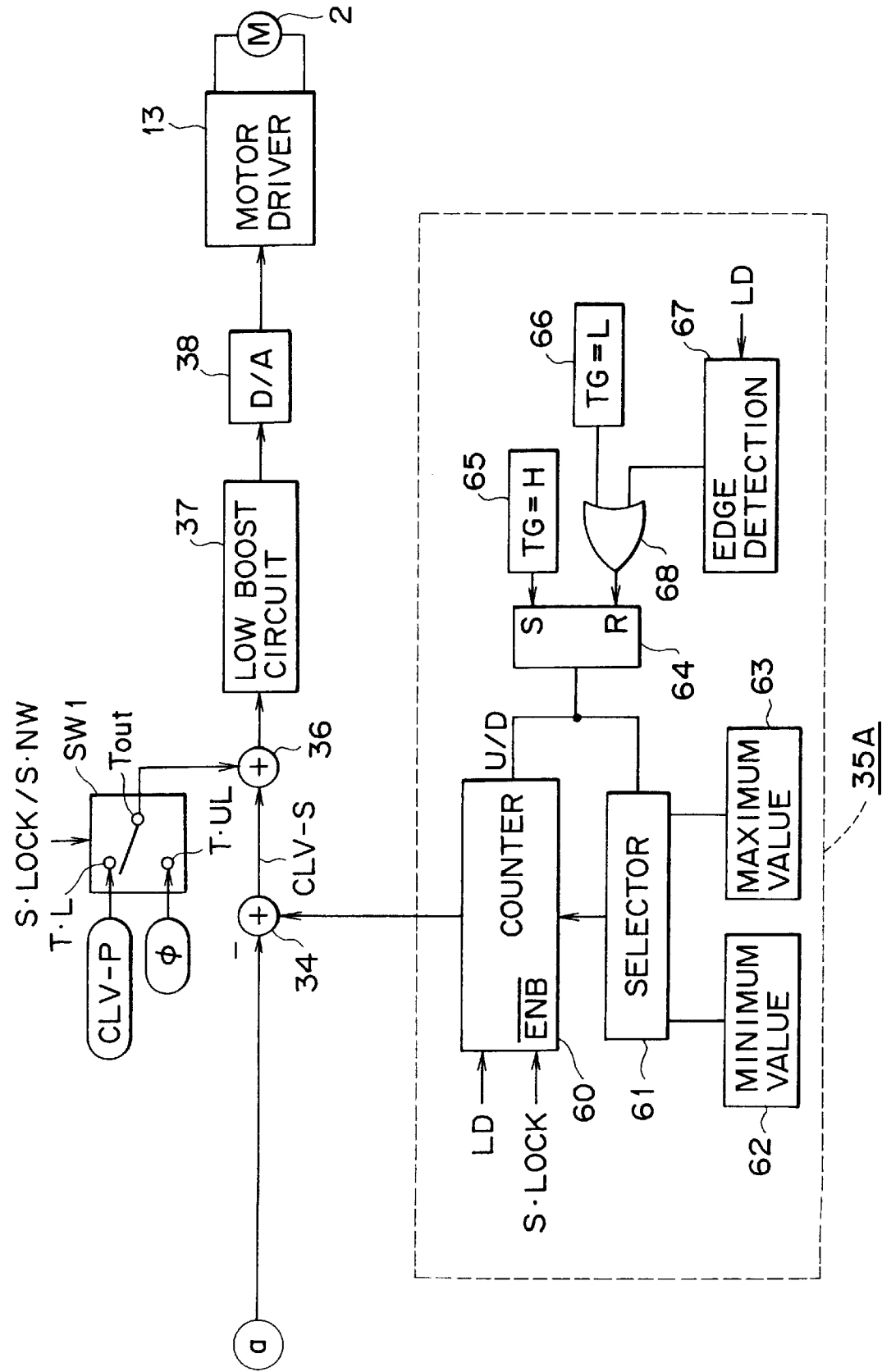

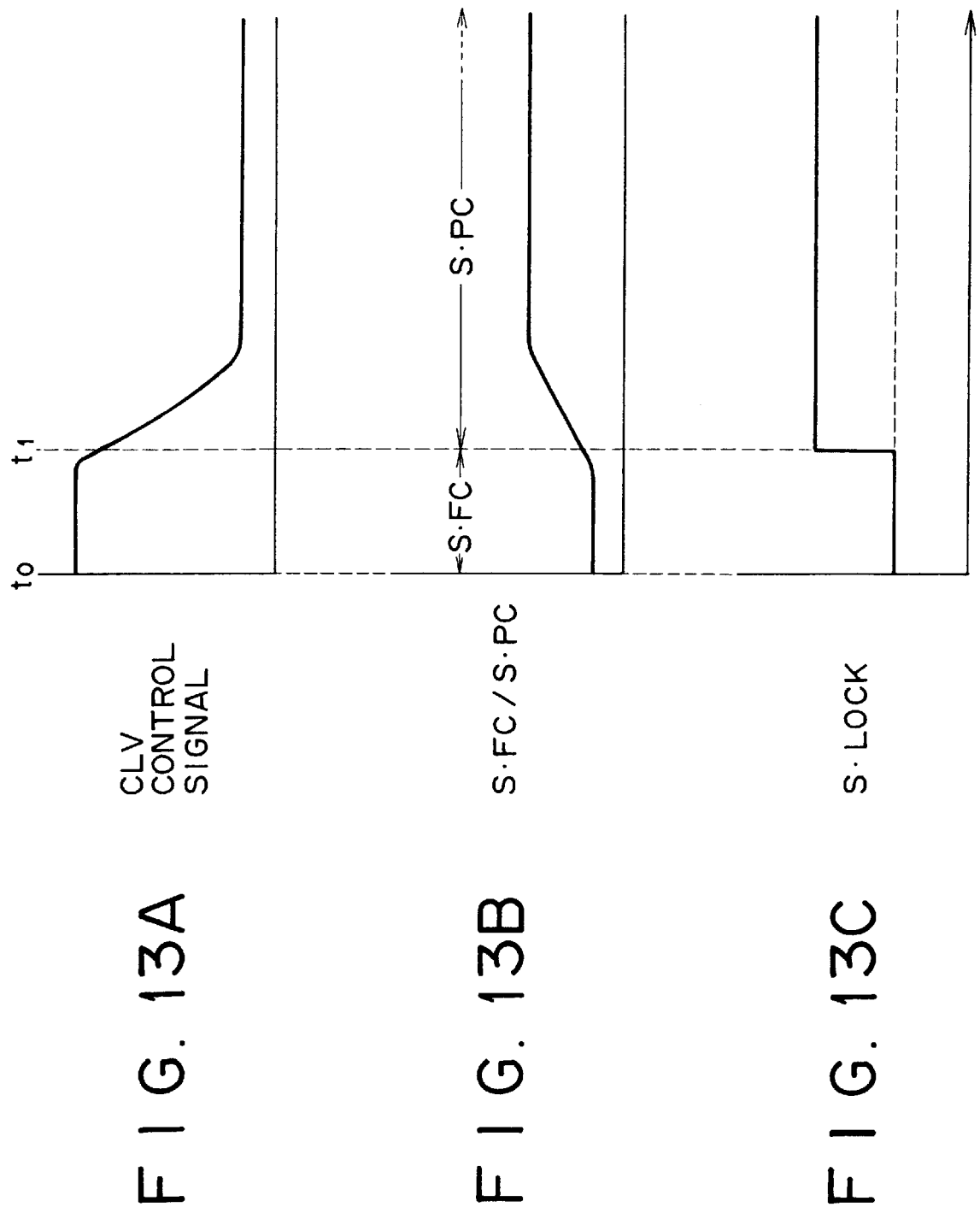

PHASE LOCKED LOOP CIRCUIT, REPRODUCTION APPARATUS AND PHASE LOCKING METHOD

BACKGROUND OF THE INVENTION

This invention relates to a reproduction apparatus which drives a disk type recording medium to rotate at a fixed linear velocity to perform data reproduction, and a phase locked loop circuit and a phase locking method applied to a reproduction apparatus of the type mentioned.

A system wherein a disk such as a compact disk (CD) or the like is employed as a recording medium has been popularized. In a system of the type mentioned, recording data for which EFM modulation (Eight to Fourteen Modulation), which is a kind of run length limited codes, has been performed are recorded onto a disk. Further, for an operation of rotating a disk, a CLV (Constant Linear Velocity) system is adopted.

In the related art CLV rotational servo, for example, an EFM signal read out from a disk is inputted to a phase locked loop circuit (hereinafter referred to simply as PLL circuit) to extract a clock, and the extracted clock is compared with a reference clock obtained by a crystal element to obtain rotational error information. Then, the rotational error information is fed back to a spindle motor for rotating a disk so that a rotational condition of a constant linear velocity may be obtained.

In order to allow such a CLV servo circuit as described above to function, the PLL circuit must be locked in a condition wherein a clock is extracted accurately. To this end, a construction for performing rough servo control for pulling, upon starting up of the spindle motor, an EFM signal extracted first into a capture range of the PLL circuit is required. In short, in a disk reproduction apparatus, for example, upon starting of rotation of the spindle, rotational servo control is first performed to some degree by a rough servo circuit, and then at a point of time when the PLL circuit is locked, the CLV servo operation is changed over from the rough servo circuit to an ordinary CLV pulling in servo circuit.

A construction of a CLV servo system for a disk reproduction apparatus is shown in FIG. 1.

Referring to FIG. 1, the CLV servo system includes a rough servo circuit 100 and a CLV velocity detection circuit 110.

In the rough servo circuit 100, an EFM signal reproduced from a disk is first inputted to a pit length measurement circuit 101. The EFM signal is run length limited codes which are defined such that a maximum reversal interval of a code train thereof is 11T and a minimum reversal interval is 3T, and the pit length measurement circuit 101 measures the pit length between edges of the inputted EFM signal with reference to a reference measurement clock produced by a crystal (XTAL) element and supplies information of a measured value to a maximum value holding circuit 102. The maximum value holding circuit 102 selectively holds a maximum value from the measurement information of the pit length inputted from the pit length measurement circuit 101 and outputs the maximum values to a minimum value holding circuit 103 in the following stage. The minimum value holding circuit 103 selectively holds a minimum value from the maximum values inputted thereto from the maximum value holding circuit 102 and outputs the minimum value. Thus held value of the minimum value holding circuit 103 exhibits a minimum pit length from maximum pit lengths obtained by the maximum value holding circuit 102.

In other words, even if the EFM signal exhibits reversal intervals longer than 11T due to a read error arising from, for example, a damage to a disk or the like, they are cancelled, and information of a maximum pit length almost close to 11T is obtained.

While information of a pit length close to 11T which is the longest reversal interval is obtained within a certain range by the minimum value holding circuit 103 in this manner, an 11T detection circuit 104 compares the pit length (reversal interval value) held by the minimum value holding circuit 103 with the pit length of 11T which serves as a reference to output an error signal of three values. In short, the 11T detection circuit 104 outputs comparison signals of three different values among three cases including a case wherein the held value by the minimum value holding circuit 103 and the pit length of 11T which serves as a reference are equal to each other, another case wherein the pit length of 11T which serves as a reference is larger and a further case wherein the pit length of 11T which serves as a reference is smaller. An error signal obtained in this manner is supplied as a pull-in servo signal CLV-1 to a spindle motor not shown in FIG. 1 so that rough servo control for a CLV is performed.

The CLV velocity detection circuit 110 includes a sync pattern detection circuit 111, to which, as seen in FIG. 1, an EFM signal and a signal PLCK (of, for example, 4.3218 MHz) which corresponds to a clock outputted from a PLL circuit (not shown in FIG. 1) for clock extraction are inputted.

At the top of one frame (588 bits) of the EFM signal, a sync pattern of 24 bits is encoded. The sync pattern is formed from fixed patterns of 11T, 11T and 2T from the top of the frame. In the sync pattern detection circuit 111, the sync pattern is detected by counting the inputted EFM signal in units of a pit (in other words, counting is performed for each 588 bits) using the signal PLCK as a reference clock.

A detection output of the sync pattern detection circuit 111 is supplied to an interpolation protection circuit 112. The interpolation protection circuit 112 executes processing of interpolation of the sync pattern, window protection and so forth if the sync pattern is not detected at an original position or the sync pattern is detected at a position at which the sync pattern should not be originally present, for example, due to a dropout of the reproduction signal, an influence of jitters or the like.

Information of the sync pattern outputted from the interpolation protection circuit 112 is branched and inputted to a frame sync production circuit 113 and a velocity counter 114. The frame sync production circuit 113 produces a frame sync signal based on the inputted detection signal of the frame sync, and the frame sync signal is utilized for required signal processing and so forth.

Meanwhile, in the velocity counter 114, the frame sync at a timing synchronized with the signal PLCK is counted with a predetermined frequency generated by a crystal element so that velocity error information may be obtained. The velocity error information is outputted as a velocity detection signal CLV-2. The velocity detection signal CLV-2 is supplied to a driver for the spindle motor not shown in FIG. 1 so that CLV control in a condition wherein the sync pattern is detected (that is, in a condition wherein the PLL circuit is locked) can be performed. It is to be noted that, though not shown here, for CLV control, for example, also a phase error signal obtained by comparing the clock produced by the PLL circuit with the predetermined frequency signal of the crystal element in phase is used together with the velocity detection signal CLV-2.

In the CLV servo system having such a construction as described above, for example, upon starting of rotation of the spindle motor, the system of the rough servo circuit 100 is utilized to perform rough servo control to control the speed of rotation of the spindle motor until the PLL circuit is pulled into its capture range as described hereinabove. Then, in a condition wherein the PLL circuit is locked, changing over from the rough servo circuit system to the system of the CLV velocity detection circuit 110 is performed so as to control the velocity of rotation of the disk to a constant linear velocity.

Also another PLL circuit having a wide capture function which contemplates expansion of a capture range and a lock range is known as a PLL circuit for reproducing a bit clock synchronized with an EFM signal. An example of a construction of a PLL circuit having such a wide capture function as mentioned above is shown in FIG. 14. It is to be noted that the PLL circuit shown in FIG. 14 has a construction which allows changing over between a normal mode by ordinary operation in which the capture range is not expanded and a wide mode in which a wide capture function is provided.

Referring to FIG. 14, the PLL circuit 200 shown includes two PLL circuit systems including a system clock PLL circuit 300 and an RF PLL circuit 400.

The system clock PLL circuit 300 includes a divider 302 which divides a reference signal of a predetermined frequency generated by an external quartz oscillator 301 and inputs the divided reference signal as a comparison reference signal to a phase frequency comparator 303. The phase frequency comparator 303 performs comparison in phase and frequency between an oscillation frequency signal of a voltage controlled oscillation circuit (VCO: Voltage Controlled Oscillator) 306 divided by a divider 307→divider 308→variable divider 309 and the reference signal mentioned above and outputs an error signal between them. The error signal is supplied to a terminal T·N of a switch 304.

The switch 304 is controlled with a normal/wide mode change-over signal outputted, for example, from a system controller not shown so that a terminal Tout thereof is connected alternatively to a terminal T·W (in a wide mode) or the terminal T·N (in a normal mode) thereof. To the terminal T·N, the error signal outputted from the phase frequency comparator 303 is supplied, and to the terminal T·W, spindle rotation information is supplied. The spindle rotation information is a signal having an information value corresponding to the speed of rotation of a spindle motor not shown for driving a disk to rotate. The signal outputted from the switch 304 is filtered by a low-pass filter 305 and inputted as an error control signal to the VCO 306.

The oscillation frequency of the VCO 306 is controlled with a voltage value as the error control signal. The oscillation frequency is outputted to the divider 307.

A switch 310 is constructed such that a terminal Tout thereof is alternatively connected to a terminal T·W or another terminal T·N thereof with a normal/wide mode change-over signal supplied thereto from a system controller not shown similarly to the switch 304. To the terminal T·W of the switch 310, a frequency signal obtained by dividing the oscillation output of the VCO 306 by means of the divider 307 is supplied, and to the terminal T·N, the reference signal from the quartz oscillator 301 is supplied. An output from the terminal Tout of the switch 310 is inputted to a divider 401 of the RFPLL circuit 400 which is described below.

In the RFPLL circuit 400, the output of the switch 310 after it passes through the divider 401 and a frequency signal obtained by passing an oscillation frequency signal of a VCO 404 through a divider 405→divider 406 are inputted to a phase comparator 402 and supplied as an error control signal through a low-pass filter 403 to the VCO 404.

To a digital PLL circuit 407, a frequency signal obtained by dividing the oscillation frequency signal of the VCO 404 by means of the divider 405 and an EFM signal reproduced from a disk not shown are inputted, and the digital PLL circuit 407 extracts a clock synchronized with the EFM signal based on a detection signal obtained by performing phase comparison based on the two signals.

As operation of the PLL circuit 200 of the construction described above, operation in the normal mode is such as follows.

In the normal mode, in both of the switch 304 and the switch 310, the terminal Tout is connected to the terminal T·N.

In this instance, the output of the VCO 306 of the system clock PLL circuit 300 is not supplied to the RFPLL circuit 400 in the following stage. Accordingly, in the normal mode, the system clock PLL circuit 300 is not used as a valid circuit.

In this instance, in the RFPLL circuit 400, the reference signal of the quartz oscillator 301 is inputted as a comparison reference signal to the phase comparator 402 through the switch 310→divider 401. The phase comparator 402 performs phase comparison between the comparison reference signal based on the reference signal of the quartz oscillator 301 and the frequency signal originating from the oscillation frequency signal of the VCO 404 and inputted thereto through the divider 405→divider 406. Consequently, the RFPLL circuit 400 is converged so that an oscillation frequency synchronized with the reference signal of the quartz oscillator 301 may be obtained. The digital PLL circuit 407 utilizes, for example, the oscillation frequency of the VCO 404 to reproduce a clock synchronized with the EFM signal. In particular, the RFPLL circuit 400 side operates, in the normal mode, so that the PLL circuit loop may be converged using the reference signal obtained from the quartz oscillator 301 as a reference.

On the other hand, operation of the PLL circuit 200 in the wide mode is such as follows. In this instance, in both of the switch 304 and the switch 310, the terminal Tout is connected to the terminal T·W.

Consequently, in the system clock PLL circuit 300, the output of the phase frequency comparator 303 is invalidated, and instead, the spindle rotation information is inputted as an error control signal from the switch 304 to the VCO 306 through the low-pass filter 305. In this instance, the oscillation frequency of the VCO 306 is variably controlled in response to the speed of rotation of the spindle motor.

In the RFPLL circuit 400, in place of the reference signal of the quartz oscillator 301, the frequency signal obtained by dividing the frequency of the VCO 306 by means of the divider 307 is further divided by the switch 310→divider 401 and inputted as a comparison reference signal to the phase comparator 402.

Consequently, the oscillation frequency of the VCO 404 of the RFPLL circuit 400 is controlled so that it may be synchronized with the frequency signal which is based on the VCO 306 on the system clock PLL circuit 300 side. This is an operation of varying the oscillation frequency of the VCO 404 so that it may follow the speed of rotation of the spindle motor. Then, since the digital PLL circuit 407 operates based on the output of the VCO 404, for example, even if the speed of rotation of the disk does not reach a prescribed CLV velocity, an operation of locking the digital PLL circuit 407 so as to be synchronized with a clock of the frequency obtained in accordance with the speed of rotation of the disk is obtained. In other words, the capture range of the PLL circuit is widened. Consequently, for example, even if a condition synchronized with the quartz oscillator 301 is not obtained, as far as the PLL circuit is locked following the speed of rotation of the disk, reading out of data by a signal processing system is possible.

In the CLV servo system having such a construction as described hereinabove with reference to FIG. 1, for example, upon starting of the spindle motor described above, if the CLV servo is lost by a disturbance such as vibrations applied from the outside or the like or if a signal drops for a long period of time, changing over to the system of the rough servo circuit 100 is performed so that rough servo control is started again. However, since the pull-in servo signal CLV-1 of the rough servo circuit 100 can assume only three values as described hereinabove, the rough servo circuit 100 can perform servo control only in a narrow bandwidth of, for example, 1 Hz or less. Consequently, a comparatively long time is required to restore the condition wherein the PLL circuit is locked.

Further, in the CLV servo system having such a construction as described hereinabove with reference to FIG. 1, since two CLV servo circuit systems including the system which includes the CLV velocity detection circuit 110 for ordinary servo control and the system of the rough servo circuit 100 for rough servo control are required naturally, the circuit scale becomes large as much.

Furthermore, in the CLV servo system described hereinabove with reference to FIG. 1, since the rough servo circuit 100 and the CLV velocity detection circuit 110 have considerably different servo characteristics from each other, even if a PLL circuit having a wide capture function which has such a circuit construction as described hereinabove with reference to FIG. 14 is used, and if a disturbance or the like continues, for example, during pull-in servo, the possibility is high that the disk rotation speed error may exceed the follow-up range of the PLL circuit, which puts the PLL circuit out of a lock condition.

Particularly with a portable CD player or the like, the possibility is high that it may suffer from a disturbance caused by rolling along the direction of rotation of the disk, and since the relative variation of the speed of rotation of the disk relative to an optical pickup is rendered significantly by the disturbance, in the lock range obtained by the PLL circuit system shown in FIG. 14 and in the control operation of the CLV servo system shown in FIG. 1, it is insufficient to achieve maintenance of a locked condition or a rapid pull-in operation of CLV servo.

Further, also with the circuit construction of the PLL circuit 200 shown in FIG. 14, since two stages of PLL circuit systems including the system clock PLL circuit 300 and the RFPLL circuit 400 are required, an increase in scale of circuit cannot be avoided similarly to the CLV servo system shown in FIG. 1, and this gives a rise also in cost.

SUMMARY OF THE INVENTION

It is an object of the present invention to provide a phase locked loop circuit for use for CLV control of rotation of a disk and reproduction of a clock, a reproduction circuit and a phase locking method by which a capture range and a lock range are expanded with a simplified construction, allowing a stabilized circuit operation.

In order to attain the object described above, according to an aspect of the present invention, there is provided a phase locked loop circuit, having a reference signal generation means for generating a reference signal having a predetermined frequency, a first counting means for counting a frequency of an output clock of voltage controlled oscillation means based on the reference signal generated by the reference signal generation means, a second counting means for counting a frequency of inputted run length limited codes based on the reference signal generated by the reference signal generation means, a calculation means for calculating difference information between the frequency of the output clock of the voltage controlled oscillation means counted by the first counting means and the frequency of the run length limited codes counted by the second counting means, an extraction means for extracting a phase error low frequency component between the output clock of the voltage controlled oscillation means and the inputted run length limited codes, a change-over means for selectively changing over between the phase error low frequency component supplied from the extraction means and the difference information supplied from the calculation means, an integration means for integrating an output of the change-over means, a phase comparison means for performing phase comparison between the output clock of the voltage controlled oscillation means and the frequency of the inputted run length limited codes and outputting phase comparison information, an addition means for adding an integration output of the integration means and the phase comparison information from the phase comparison means to produce an oscillation control signal and an outputting the oscillation control signal to the voltage controlled oscillation means, a lock discrimination means for discriminating whether or not a phase locked loop is locked, and a change-over control means for controlling such that, when it is discriminated by the lock discrimination means that the phase locked loop is locked, the phase error low frequency component supplied from the extraction means is selected so as to be inputted to the integration circuit, or when it is discriminated by the lock discrimination means that the phase locked loop is not locked, the difference information supplied from the calculation means is selected so as to be inputted to the integration circuit.

According to another aspect of the present invention, there is provided a reproduction apparatus which drives a disk type recording medium, on which run length limited codes are recorded in advance, to rotate at a constant linear velocity, having a reproduction means for reproducing the run length limited codes from the disk type recording medium, a reference signal generation means for generating a reference signal having a predetermined frequency, a first counting means for counting a frequency of an output clock of voltage controlled oscillation means based on the reference signal generated by the reference signal generation means, a second counting means for counting a frequency of the run length limited codes reproduced by the reproduction means based on the reference signal generated by the reference signal generation means, a calculation means for calculating difference information between the frequency of the output clock of the voltage controlled oscillation means counted by the first counting means and the frequency of the run length limited codes counted by the second counting means, an extraction means for extracting a phase error low frequency component between the output clock of the voltage controlled oscillation means and the run length limited codes reproduced by the reproduction means, a change-over means for selectively changing over between the phase error low frequency component supplied from the extraction means and the difference information supplied from the calculation means, an integration means for integrating an output of the change-over means, a phase comparison means for performing phase comparison between the output clock of the voltage controlled oscillation means and the frequency of the run length limited codes reproduced by the reproduction means and outputting phase comparison information, an addition means for adding an integration output of the integration means and the phase comparison information from the phase comparison means to produce an oscillation control signal and outputting the oscillation control signal to the voltage controlled oscillation means, a lock discrimination means for discriminating whether or not a phase locked loop is locked, and a change-over control means for controlling such that, when it is discriminated by the lock discrimination means that the phase locked loop is locked, the phase error low frequency component supplied from the extraction means is selected so as to be inputted to the integration circuit, or when it is discriminated by the lock discrimination means that the phase locked loop is not locked, the difference information supplied from the calculation means is selected so as to be inputted to the integration circuit.

In the phase locked loop circuit and the reproduction apparatus, as operation in the wide mode for widening the capture range and the lock range of the phase locked loop circuit, before the phase locked loop circuit is locked, the output clock of the voltage controlled oscillation means is counted with reference to the reference clock of reference signal generation means, and an error component between the frequency of run length limited codes reproduced from a disk and the reference clock is extracted. Then, the phase locked loop circuit is constructed based on a result of addition of the counted value of the output clock and the extracted error component. After the phase locked loop circuit is locked, a phase error of the output clock of the voltage controlled oscillation means from the run length limited codes reproduced from the disk is detected, and the phase locked loop circuit is constructed based on the detected phase error.

Consequently, the phase locked loop circuit operates by control based, before the phase locked loop circuit is locked, on the error information of the run length limited codes, but after the phase locked loop circuit is locked, on the phase error low frequency component, so that it may follow the frequency of the run length limited codes which corresponds to the speed of rotation of the disk. As a result, the actual capture range and lock range are expanded such that they are limited only by the range of the oscillation frequency of the voltage controlled oscillation means.

Consequently, with the phase locked loop circuit and the reproduction apparatus, since a strong wide capture and wide lock function are provided, the shock proof performance against a disturbance to rotation of the disk is improved as much. Accordingly, the present invention can be applied particularly effectively to a portable reproduction apparatus.

Further, in order to realize the wide capture and wide lock function, two PLL circuits as in the related art are not required, but only one PLL circuit system is required. Consequently, reduction in circuit scale and reduction in cost can be achieved as much.

Further, while the difference information based on the frequency of the run length limited codes is used as the reference information for obtaining the error information of the frequency of the voltage controlled oscillation means before the phase locked loop circuit is locked, since control for pull-in the difference information so that it maybe locked by the phase locked loop circuit, pull-in control for the velocity of the disk is performed with a control value having a higher resolution than that used, for example, in a related art rough servo circuit system. Consequently, operation of the phase locked loop circuit which is stabilized as much can be anticipated.

According to a further aspect of the present invention, there is provided a phase locking method for driving a disk type recording medium, on which run length limited codes are recorded in advance, to rotate at a constant linear velocity, having the steps of counting a frequency of an output clock of a voltage controlled oscillation circuit based on a reference signal having a predetermined frequency, counting a frequency of the run length limited codes based on the reference signal, calculating difference information between the counted frequency of the output clock of the voltage controlled oscillation circuit and the counted frequency of the run length limited codes, extracting a phase error low frequency component between the output clock of the voltage controlled oscillation circuit and the run length limited codes, selectively changing over between the extracted phase error low frequency component and the calculated difference information and integrating the selected output, performing phase comparison between the output clock of the voltage controlled oscillation circuit and the frequency of the run length limited codes to produce phase comparison information, adding the integrated output signal and the phase comparison information to produce an oscillation control signal, and discriminating whether or not a phase locked loop is locked and selecting, when it is discriminated that the phase locked loop is locked, the extracted phase error low frequency component so as to be integrated by the integrating step, but selecting, when it is discriminated that the phase locked loop is not locked, the calculated difference information so as to be integrated by the integrating step.

With the phase locking method, in the normal mode, the oscillation frequency of the voltage controlled oscillation circuit of the phase locked loop circuit side is controlled so as to be fixed at a predetermined central frequency, and in the CLV servo system, the frequency aimed value for error detection of the CLV velocity (frequency of the EFM signal) is varied between the maximum value and the minimum value set based on an average value of a number of reversals of a code train which is generated for each period of a frame unit of the EFM signal. Consequently, also as pull-in control in the normal mode, while such a rough servo circuit system as in the related art is omitted, taking over from pull-in control to ordinary CLV control can be performed by a single CLV servo circuit system, thereby simplifying the circuit system of the phase locked loop circuit. On the other hand, in the wide mode, control is performed such that, while the frequency aimed value of the CLV servo circuit system is fixed, the oscillation frequency of the voltage controlled oscillation circuit is varied within the variation range set corresponding to the maximum value and the minimum value of the EFM signal frequency. Consequently, for example, a pull-in operation which is improved in rapidity can be obtained.

The above and other objects, features and advantages of the present invention will become apparent from the following description and the appended claims, taken in conjunction with the accompanying drawings in which like parts or elements denoted by like reference symbols.

BRIEF DESCRIPTION OF THE DRAWINGS

FIGS. 2, 2A and 2B are block diagrams showing a disk reproduction apparatus to which a rotation servo circuit of the present invention is applied;

FIG. 3 is a diagrammatic view illustrating a data structure of one frame unit recorded on a disk employed in the disk reproduction apparatus of FIG. 2;

FIGS. 4, 4A and 4B are block diagrams showing PLL and CLV servo circuits of the disk reproduction apparatus of FIG. 2;

FIGS. 5 to 8 are diagrammatic views showing generation patterns of a run length limited code which may possibly be generated from a disk employed in the disk reproduction apparatus of FIG. 2;

FIGS. 9, 9A and 9B are block diagrams of the CLV servo circuit shown in FIG. 2 which includes a CLV target variation setting circuit which is used upon rough servo of the disk reproduction apparatus of FIG. 2;

FIG. 13A is a timing chart of a CLV control signal supplied from a CLV control circuit to a motor driver of the disk reproduction apparatus of FIG. 2;

FIG. 13B is a timing chart illustrating a change-over from a frequency error signal S·FC to a phase error signal S·PC in the disk reproduction apparatus of FIG. 2;

FIG. 13C is a timing chart illustrating a transition of a lock signal S·LOCK indicating a locking condition; and FIGS. 14, 14A and 14B are block diagrams showing a PLL circuit in the related art.

DESCRIPTION OF THE PREFERRED EMBODIMENT

In the following, an embodiment of the present invention is described with reference to FIGS. 2 to 12. The description below is given in the following order:

1. Construction of Reproduction Apparatus
2. PLL/CLV Servo Circuit
2-a. Construction of PLL/CLV Servo Circuit
2-b. Construction of CLV Target Setting Circuit
2-c. Operation in Normal Mode
2-d. CLV Target Variation Setting Operation by Software
2-e. Operation in Wide Mode
2-f. Variable Velocity Reproduction Operation

1. Construction of Reproduction Apparatus

Figure 1:
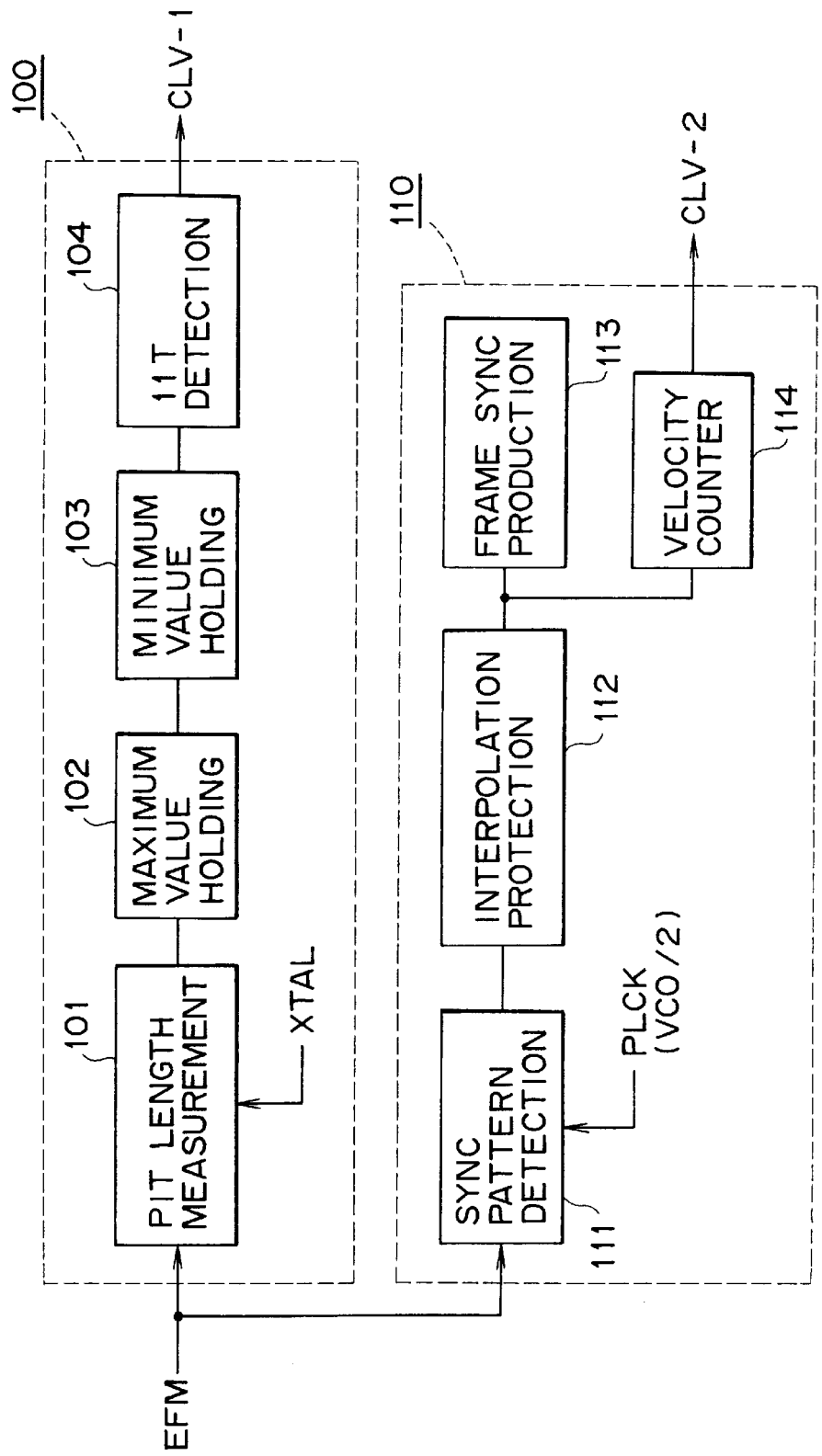
FIG. 1 is a block diagram showing a rotation servo circuit in the related art.
Figure 2A:
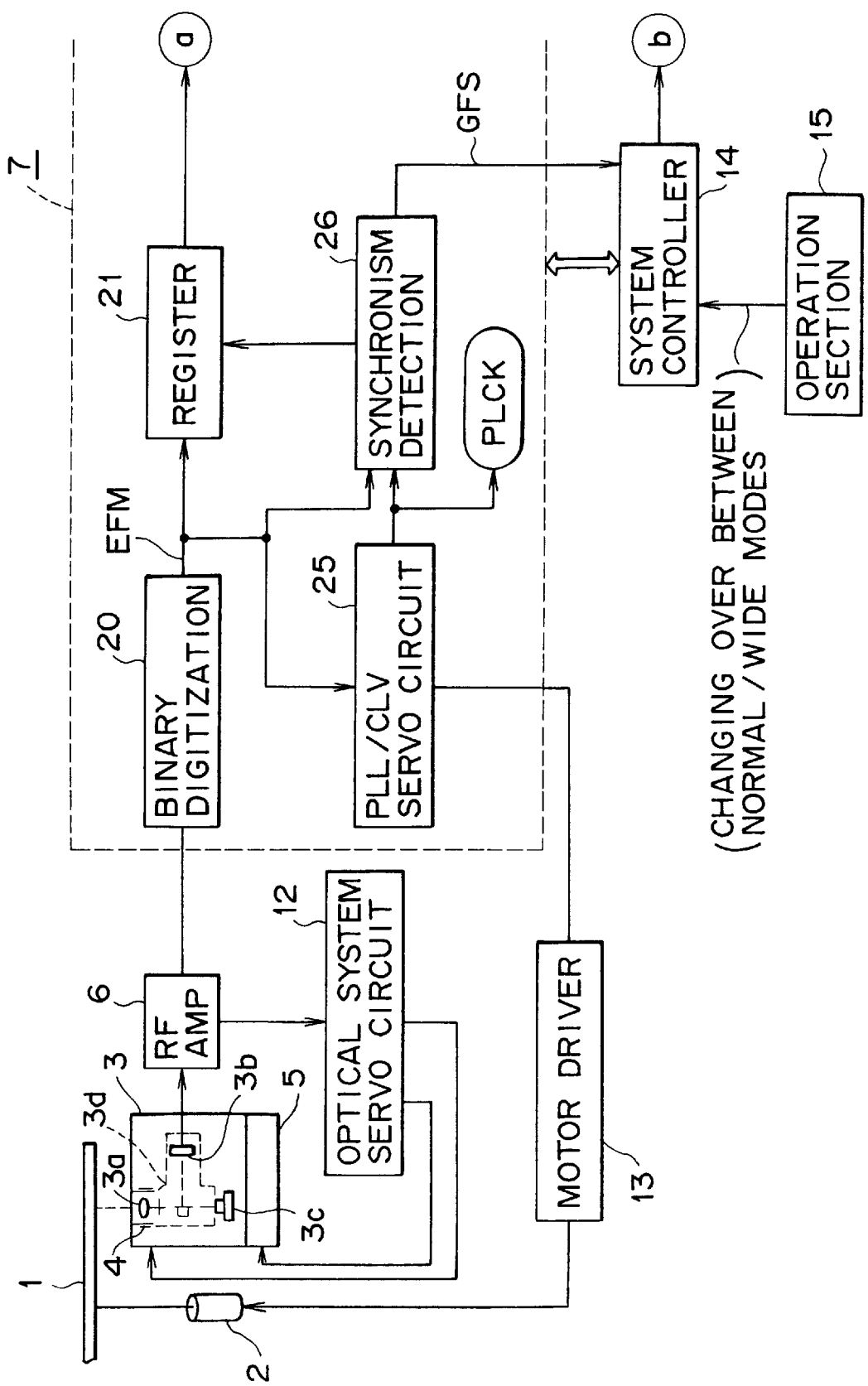

FIG. 2 shows an example of a construction of essential part of a CD player as a reproduction apparatus which includes a rotational speed control apparatus and a rotational driving apparatus for CLV servo control to which the present invention is applied. It is to be noted that the CD player of the present embodiment is formed as, for example, a portable apparatus and has, to this end, a construction which allows setting of change-over between a shock proof mode (wide mode) which allows outputting of an audio signal as stably as possible irrespective of a disturbance by vibrations or rolling when the CD player is carried and a normal mode in which an ordinary reproduction operation is performed.

Referring to FIG. 2, information of a disk 1 is read by an optical head 3 while the disk 1 is driven by a spindle motor 2 to rotate at a constant linear velocity (CLV). The optical head 3 irradiates a laser beam upon the disk 1 and reads information recorded, for example, in the form of pits on the disk 1 from reflected light from the disk 1.

In order to allow a data reading out operation from the disk 1 in such a manner as described above, the optical head 3 includes a laser diode 3c for outputting a laser beam, an optical system 3d composed of a polarizing beam splitter, a quarter wavelength plate and so forth, an objective lens 3a serving as a laser outputting end, a detector 3b for detecting reflected light, and so forth.

The objective lens 3a is held for displacement in a disk radial direction (tracking direction) and a direction toward or away from the disk 1 by a biaxial mechanism 4. Further, the entire optical head 3 is mounted for movement in a radial direction of the disk by a sled mechanism 5.

Information detected from the disk 1 by a reproduction operation of the optical head 3 described above is supplied to a RF amplifier 6. The RF amplifier 6 performs amplification processing, required calculation processing and so forth for the inputted information to produce a reproduction RF signal, a tracking error signal, a focusing error signal and other required signals.

An optical system servo circuit 12 generates various servo driving signals based on the tracking error signal and the focusing error signal supplied thereto from the RF amplifier 6 and a track jumping instruction, an accessing instruction and so forth from a system controller 14 to control the biaxial mechanism 4 and the sled mechanism 5 to perform focusing control, tracing control and sled control.

The reproduction RF signal obtained by the RF amplifier 6 is supplied to a binary digitization circuit 20 in a signal processing circuit 7 and it is outputted as a binary digitized EFM signal (Eight to Fourteen Modulation signal) from the binary digitization circuit 20. The binary digitized EFM signal is then supplied to a register 21, a PLL/CLV servo circuit 25 and a synchronism detection circuit 26.

The tracking error signal and focusing error signal are supplied to the optical system servo circuit 12.

The EFM signal is supplied from the binary digitization circuit 20 to an EFM decoding circuit 22 through the register 21 and is EFM demodulated by the EFM decoding circuit 22. In particular, Fourteen to Eight demodulation processing is performed by the EFM decoding circuit 22. The data EFM demodulated by the EFM decoding circuit 22 is supplied to an ECC (Error Correction Coding)/de-interleave processing circuit 23. The ECC/de-interleave processing circuit 23 performs writing and reading out operations of the data supplied thereto into and from a RAM 24 at predetermined timings to successively perform error correction processing and de-interleaving processing. The data for which the error correction processing and the de-interleaving processing have been performed by the ECC/de-interleave processing circuit 23 are supplied to a memory controller 8 which will be hereinafter described.

The PLL/CLV servo circuit 25 receives the EFM signal supplied thereto from the binary digitization circuit 20 and causes a PLL circuit to operate so that it outputs a signal PLCK as a reproduction clock synchronized with the EFM signal. The signal PLCK is used as a master clock and hence as a processing reference clock in the signal processing circuit 7. Consequently, operation timings of a signal processing system of the signal processing circuit 7 follow the rotational speed of the spindle motor 2. Here, the frequency of the signal PLCK while the PLL circuit is locked under the condition that the disk 1 is driven at a CLV of the n-tuple velocity is, for example, n×4.3218 MHz.

In the present embodiment, since the signal processing circuit 7 operates with a clock conforming to the rotational speed of the spindle motor 2, for example, even if the spindle motor 2 is not rotating at a particular CLV speed, as far as the PLL circuit is locked to allow detection of the sync pattern, processing for read-out data can be performed.

The PLL/CLV servo circuit 25 produces a CLV servo signal for CLV control making use of a signal obtained by an operation of the PLL circuit described above, the inputted EFM signal and so forth and supplies the CLV servo signal to a motor driver 13. An internal construction of the PLL/CLV servo circuit 25 will be hereinafter described.

The motor driver 13 produces a motor driving signal based on the CLV servo signal supplied thereto from the PLL/CLV servo circuit 25 and supplies the motor driving signal to the spindle motor 2. Consequently, the spindle motor 2 is driven so that it is rotated at a constant linear velocity with respect to the disk 1.

The synchronism detection circuit 26 uses the signal PLCK inputted thereto from the PLL/CLV servo circuit 25 as a reference clock to perform an operation for detecting the frame sync from within the EFM signal inputted thereto from the binary digitization circuit 20. A construction of one frame of the EFM signal is illustrated in FIG. 3. Of 588 bits which form one frame, the top 24 bits form a sync pattern. The sync pattern is a fixed pattern formed from a succession of reversal periods of 11T, 11T and 2T as seen in FIG. 3.

Further, the synchronism detection circuit 26 performs interpolation processing of the frame sync, processing of window protection and so forth in order to cope with a case wherein a frame sync pattern in data drops by a dropout or an influence of jitters or a same frame sync pattern is detected. The register 21 operates in response to an output of the synchronism detection circuit 26. Further, for example, when the number '24' of bits of the frame sync is obtained appropriately as a count value at a timing of the signal PLCK, the synchronism detection circuit 26 outputs a signal GFS (Guard Frame Sync signal) indicative of a condition that the frame sync is detected appropriately. The signal GFS is outputted to the system controller 14.

Here, since the condition that the frame sync is detected appropriately by the synchronism detection circuit 26 in such a manner as described above corresponds to a condition wherein the PLL circuit is locked by the PLL/CLV servo circuit 25, the system controller 14 can output, while the signal GFS is outputted, a lock signal S·LOCK indicating that the PLL circuit is in a locked condition. The lock signal S·LOCK is utilized, though not illustrated in FIG. 2, for changing over of operation of the PLL/CLV servo circuit 25 as hereinafter described.

The data outputted from the ECC/de-interleave processing circuit 23 of the signal processing circuit 7 in such a manner as described above are digital audio data based on quantization bits of 16 bits and 44.1 KHz sampling. The digital audio data are supplied to the memory controller 8.

For example, where the shock proof mode described above is set, the spindle motor 2 is controlled to rotate within a velocity range higher than that in the normal mode (one-tuple velocity). Consequently, also signal processing of the signal processing circuit 7 is performed at a higher rate than that in the normal mode in response to the rotational speed of the spindle motor 2. Then, digital audio data outputted at the high rate from the signal processing circuit 7 are written into a RAM (buffer memory) 9 under the control of the memory controller 8 to perform storage of the data, whereas reading out from the RAM 9 is controlled in accordance with the ordinary rate by the memory controller 8. The digital audio data are converted into an analog signal by a D/A converter 10, and as a result, an audio signal which is outputted from an audio output terminal 11 has an ordinary pitch and rate.

On the other hand, when the normal mode is set, the spindle motor 2 is controlled to rotate in a speed range corresponding to that in the normal mode, and signal processing of the signal processing circuit 7 is performed at a rate corresponding to the rotational speed. In this instance, time base correction is performed by write and read-out controls for the RAM 9 by the memory controller 8. Consequently, in the normal mode, the pitch and the rate of the audio signal outputted from the audio output terminal 11 are same as ordinary ones. It is to be noted that operation of the memory controller 8 is controlled by the system controller 14.

The system controller 14 includes a microcomputer and so forth and performs controlling processing suitably in response to required operations to be performed by various functioning circuit sections which compose the CD player. An operation section 15 includes various keys for performing operations to execute various required operations including reproduction, pause, stopping and search, and such operation information is supplied to the system controller 14. The system controller 14 performs required controlling operation suitably based on the operation information inputted thereto. Particularly in the present embodiment, the operation section 15 includes a mode change-over key for performing changing over setting between the normal mode and the shock proof mode described above.

2. PLL/CLV Serve Circuit 2-a. Construction of PLL/CLV Servo Circuit

Figure 4B:
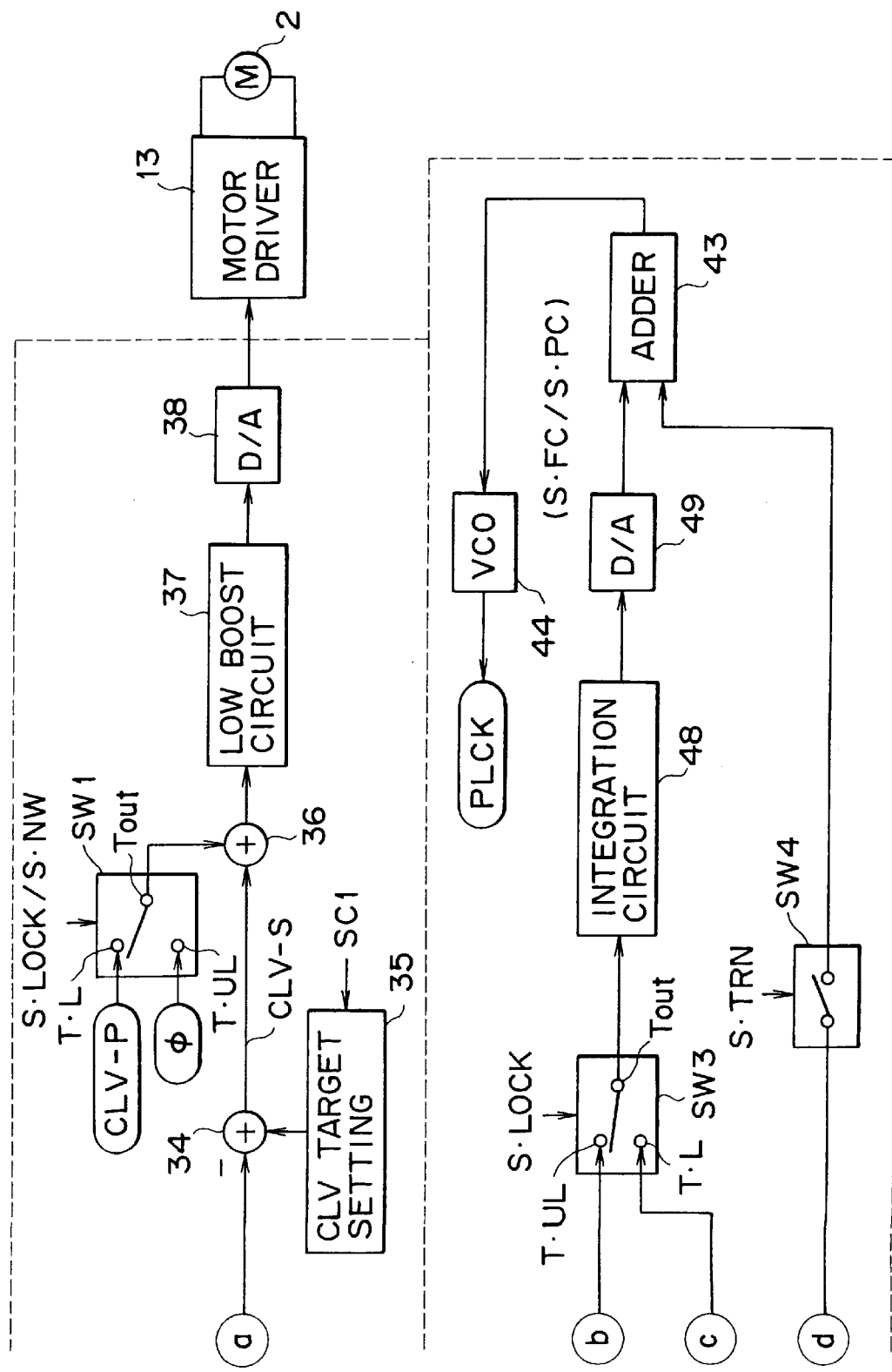

FIG. 4 shows an example of a construction of the PLL/CLV servo circuit 25 in the signal processing circuit 7 shown in FIG. 2. Referring to FIG. 4, the PLL/CLV servo circuit 25 includes a CLV servo circuit system 25A and a PLL circuit system 25B.

In the CLV servo circuit system 25A, an EFM signal divided at a predetermined dividing ratio, for example, by a divider 30 and a frequency signal FS obtained by dividing an oscillation frequency (for example, 16.934 MHz) outputted from a quartz oscillator 31 by means of a divider 32 are inputted to a CLV velocity counter 33. Here, the frequency signal FS outputted from the divider 32 is represented by $$FS = n \times RFCK/64$$

where RFCK is a lead frame clock which is a frequency signal of 7.35 KHz generated by a crystal element. Meanwhile, the variable n represents a multiple velocity with reference to a velocity at which the disk 1 is driven at a CLV of a one-tuple. Accordingly, if the disk 1 is driven at a one-tuple velocity, then since n=1, the frequency signal FS is given by $$FS = 1 \times 7,350/64 = 114.84375 \text{ Hz}$$

and is substantially 115 Hz. This is, when converted into a time, a comparatively long period of approximately 9 ms.

The CLV velocity counter 33 counts the number of edges of the inputted EFM signal using, for example, the frequency signal FS as a sampling period. In the present embodiment, a frequency value of the EFM signal which can be detected based on information of the number of edges of the EFM signal obtained for each period of the frequency signal FS is handled as CLV velocity information, and a result of the measurement is outputted.

The measurement output of the CLV velocity counter 33 is supplied to a subtractor 34 and a PLL target variation circuit 39 of the CLV servo circuit system 25A side.

The subtractor 34 subtracts the measurement output of the CLV velocity counter 33 from a CLV target value outputted from a CLV target setting circuit 35 to obtain a velocity error signal CLV-S which is error information of a CLV velocity error at present from a CLV velocity which makes a target.

It is to be noted that, in the present embodiment, in such a condition that a locked state of the PLL circuit is lost by a failure in serving, a miss of a signal for a long period or the like upon starting of the spindle motor 2 or during reproduction, a "CLV scanning mode" for pulling the PLL circuit into its capture range is set.

In the CLV scanning mode in the normal mode, the CLV target setting circuit 35 varies the CLV target value so that it may sweep within a range corresponding to a frequency range which can be taken by the EFM signal. on the other hand, in the shock proof mode, irrespective of whether the ordinary CLV servo control mode or the CLV scanning mode is set, a CLV target value of a predetermined fixed value is set. This control is performed with a control signal SC1 supplied from the system controller 14.

The velocity error signal CLV-S outputted from the subtractor 34 is inputted to an adder 36. To the other input of the adder 36, a phase error signal CLV-P (terminal T·L side) or a fixed value (terminal T·UL side) of '0' is inputted through a switch SW1.

The switch SW1 has a terminal Tout which is alternatively connected to one of the terminal T·L and the terminal T·UL, and the switching control condition thereof is controlled, in the normal mode, with the lock signal S·LOCK outputted from the system controller 14 shown in FIG. 2. The lock signal S·LOCK indicates whether or not the PLL circuit system is locked as described hereinabove. If the PLL circuit system is locked, then the lock signal S·LOCK has the H level, but if the PLL circuit system is not locked, then the lock signal S·LOCK has the L level.

When the lock signal S·LOCK has the H level, the terminal Tout of the switch SW1 is connected to the terminal T·L, on the other hand, when the lock signal S·LOCK has the L level, the terminal Tout of the switch SW1 is connected to the terminal T·UL. Accordingly, to the adder 36, the phase error signal CLV-P is supplied when the PLL circuit is locked, or the fixed value of '0' is supplied when the PLL circuit is not locked.

However, also a mode change-over signal S·NW corresponding to the normal/wide mode outputted from the system controller 14 is inputted to the switch SW1. When the mode change-over signal S·NW represents the wide mode, the lock signal S·LOCK is rendered invalid for switching control of the switch SW1, and the switch SW1 is fixed to the terminal T·UL. In short, irrespective of whether or not the PLL circuit is locked, the fixed value of '0' is outputted steadily from the switch SW1.

It is to be noted that the phase error signal CLV-P is obtained, for example, by phase comparison between the oscillation frequency of a voltage controlled oscillator (VCO) 44 of the PLL circuit system 25B and a reference frequency signal of a crystal element, and is handled as rotational phase error information of the CLV servo.

The adder 36 adds the velocity error signal CLV-S and the phase error signal CLV-P and the resultant signal is passed through a low boost circuit 37, which is formed by a combination of, for example, a digital low-pass filter, a bypass circuit and so forth and removes low frequency components from the output of the adder 36. An output of the low boost circuit 37 is supplied to a D/A converter 38.

The D/A converter 38 converts the output of the low boost circuit 37 in the form of a digital signal into an analog value and supplies the analog value as a CLV servo control signal to the motor driver 13 (refer to FIG. 2). The motor driver 13 produces a motor driving signal based on the CLV servo control signal supplied thereto and supplies the motor driving signal to the spindle motor 2 so that the rotational speed of the spindle motor 2 may be variably controlled in response to the CLV servo control signal.

Meanwhile, the PLL circuit system 25B includes the voltage controlled oscillation circuit (VCO) 44 for producing a frequency signal PLCK as a reproduction clock. The oscillation frequency of the VCO 44 is variably controlled in response to the output of an adder 43 which will be hereinafter described. While it is illustrated in FIG. 3 that the frequency signal PLCK is outputted directly from the VCO 44 for the convenience of illustration, it is to be noted that a frequency obtained by dividing the oscillation frequency of the VCO 44 into half is actually used as the frequency signal PLCK, and, for example, if the PLL circuit is locked while the disk is driven to rotate at a one-tuple speed, the frequency of the frequency signal PLCK is PLCK=4.3218 MHz.

An analog PCO circuit 41 as a phase comparator compares the EFM signal with the signal PLCK/2 in phase and outputs a detection output thereof to a filter 42. The filter 42 filters the detection output of the analog PCO circuit 41 and outputs it as an error control signal S·E for controlling the oscillation frequency of the VCO 44. The error control signal S·E is supplied to the adder 43 through a switch SW4.

The switch SW4 is controlled between on and off with a training signal S·TRN outputted from the system controller 14.

In the case of the present embodiment, for example, upon starting of rotation of the disk 1 or when a drop of a disk read signal occurs in the normal mode, it is detected that the condition that the EFM signal is not inputted to the PLL circuit continues for a certain long period of time, then a training mode in which, as operation of the PLL circuit, the oscillation frequency of the VCO 44 is held at the central frequency is to be set. Otherwise, the training mode may be set also by a predetermined manual operation. The training signal S·TRN is a signal which is outputted when the training mode is set, and in response to the training signal S·TRN, the switch SW4 is controlled such that it is switched off in the training mode, but in ordinary operation other than in the training mode, it is switched on. In short, in the training mode, a signal component based on the detection output of the analog PCO circuit 41 is not utilized for oscillation frequency control of the VCO 44.

Although detailed description is omitted here, in the training mode, a measurement output of an FCO counter 45 which will be hereinafter described is subtracted from a PLL target value outputted from a PLL target fixed value register 40 to obtain an error signal by means of an adder 46, and the oscillation frequency of the VCO 44 is controlled with a control signal obtained by integrating the error signal by means of an integration circuit 48. As a result, an operation to converge the oscillation frequency of the VCO maintained at a required central frequency is obtained.

A basic construction of the PLL circuit system 25B includes a loop of the analog PCO circuit 41→filter 42→

(switch SW4→adder 43)→VCO 44. In addition, the basic construction includes an automatic adjustment circuit system for the central frequency of the VCO 44 including the FCO (Frequency Comparator Output) counter 45, and a wide lock circuit system including a PCI (Phase Comparator Integration) circuit 50 for expanding the lock range of the PLL circuit. Further, the automatic adjustment circuit system is constructed also such that the capture range of the PLL circuit is expanded by varying the PLL target value which is to be compared with a measurement output of the FCO counter 45.

In the present embodiment, circuit operation for expanding the capture range and the lock range described above are performed in the shock proof mode. Accordingly, the operation mode of the PLL/CLV servo circuit 25 in the shock proof mode is hereinafter referred to particularly as "wide mode".

The FCO counter 45 counts a frequency signal PLCK/36 using a frequency signal FS of a crystal element as a sampling period to measure the frequency of the frequency signal PLCK. The measurement output of the FCO counter 45 is supplied to a subtractor 46.

The subtractor 46 subtracts the measurement output of the FCO counter 45 from a PLL target value inputted thereto through a switch SW2. The PLL target value is an aimed value of the frequency of the frequency signal PLCK for convergence to the central frequency set for the VCO 44. Accordingly, from the subtractor 46, error information of the frequency of the frequency signal PLCK at present is obtained.

The switch SW2 has a terminal Tout to which a terminal T·W or another terminal T·N thereof is connected alternatively, and the switching of the connection is controlled with the mode change-over signal S·NW corresponding to the normal/wide mode supplied from the system controller 14. When the mode change-over signal S·NW represents the normal mode, the terminal Tout is connected to the terminal T·N, but when the mode change-over signal S·NW represents the wide mode, the terminal Tout is connected to the terminal T·W.

To the terminal T·N of the switch SW2, the PLL target fixed value register 40 in which a predetermined PLL target value is set as a fixed value is connected, but to the terminal T·W, the output of the PLL target variation circuit 39 is supplied. The PLL target variation circuit 39 varies the velocity error signal CLV-S, which is an output of the CLV velocity counter 33, within a predetermined range as hereinafter described and outputs a resulting signal. The variation control of the value of the velocity information signal CLV-S is performed with a control signal SC2 outputted from the system controller 14.

The error information outputted from the subtractor 46 is supplied to a terminal T·UL of a switch SW3 through an amplifier 47.

The switch SW3 has a terminal Tout which is connected to a terminal T·L thereof when the lock signal S·LOCK has the H level (indicating a condition wherein the PLL circuit is locked), but is connected to the terminal T·UL thereof when the lock signal S·LOCK has the L level (indicating another condition wherein the PLL is not locked). It is to be noted that, to the terminal T·UL, a detection output of a PCI circuit 50 which will be hereinafter described is supplied through an amplifier 51 and a switch SW5.

The integration circuit 48 performs integration of an information value outputted from the terminal Tout of the switch SW3 and outputs an integration output thereof to a D/A converter 49. The D/A converter 49 converts an information value from the terminal Tout as digital information into an information signal in the form of an analog signal and outputs the information signal to the adder 43. The adder 43 adds the output of the D/A converter 49 and a phase error signal supplied thereto from the analog PCO circuit 41 side and outputs an addition signal thereof as a control voltage for controlling the oscillation frequency of the VCO 44.

The PCI (Phase Comparator Integration) circuit 50 is a phase information detection circuit formed from a digital circuit, and it detects and outputs low frequency components of a phase error of the frequency signal PLCK with respect to the inputted EFM signal. While an error is produced between the two phase detection outputs originating from the facts that, for example, the analog PCO circuit 41 is formed as an analog circuit and the PCI circuit 50 is formed as a digital circuit, in the present embodiment, the error between them is eliminated by providing an offset value corresponding to the error to the detection output of the PCI circuit 50. The output of the PCI circuit 50 can be regarded as information which represents a frequency difference between the EFM signal and the frequency signal PLCK within a range within which the phase is locked.

An output signal of the PCI circuit 50 is supplied to the terminal T·L of the switch SW3 through the amplifier 51 and the switch SW5.

Where the output signal of the PCI circuit 50 is inputted to the integration circuit 48 through the switch SW5→switch SW3, the integration value outputted from the integration circuit 48 is converted into an analog signal by the D/A converter 49 and outputted as a phase error signal S·PC.

2-b. Construction of CLV Target Setting Circuit

Subsequently, a construction of the CLV target setting circuit 35 provided in the CLV servo circuit system 25A is described.

In the CLV scanning mode in the normal mode, under the presumption that, in the automatic adjustment mode of the central frequency, the VCO 44 of the PLL circuit system 25B operates such that it is fixed at the central frequency (PLCK=4.3218 MHz), the CLV target setting circuit 35 of the CLV servo circuit system 25A varies the CLV target value so that it sweeps within a predetermined range in accordance with the control signal SC1. Consequently, CLV control can be performed so that the PLL circuit may be locked without using rough servo control as in the related art.

Here, a setting method for the sweep range of the target value to be set by the CLV target setting circuit 35 is described.

While the CLV target value is compared with CLV velocity information detected by the CLV velocity counter 33, the CLV velocity information detected by the CLV velocity counter 33 is frequency information of the EFM signal obtained by counting the number of edges of the EFM signal using the frequency signal RFCK/64 as a sampling clock as described hereinabove with reference to FIG. 2. Consequently, the value which can be assumed by the CLV target value must correspond to the frequency which may be assumed by the EFM signal. However, the frequency of the EFM signal varies within a certain range in accordance with a state of a code train composed of reversal intervals of 3T to 11T. Thus, in the present embodiment, a maximum value and a minimum value of the CLV target value to be varied are determined in the following manner.

Here, 256 ways of EFM words (14 bits) to be EFM encoded individually corresponding to original 8 bits data of 0 to FF are illustrated in FIGS. 5, 6, 7 and 8. In short, an EFM conversion table is shown FIGS. 5 to 8.

An EFM word is a pulse reversal signal of the NRZI (Non Return to Zero Inverted) system, and accordingly, the position of "1" of each EFM word presents a pulse reversal position.

In FIGS. 5 to 8, the EFM words together with pulse reversal numbers (that is, the numbers of "1") of the EFM words are indicated.

The 256 EFM words are selected from 16,384 ($2^{14}$) patterns which are possible with 14 bits so as to correspond to 8 bits data, and particularly, they satisfy the condition that two or more "0"s are placed between "1" and "1". Further, among the reversal intervals (intervals between "1" and "1"), the minimum reversal interval is 3T and the maximum reversal interval is 11T.

Here, the numbers of reversal in one word indicated for the individual EFM words in FIGS. 5 to 8 are summed up in the following manner.

| | | |
|---|---|---|
| EFM words including 1 reversal: | 4 | words |
| EFM words including 2 reversals: | 56 | words |
| EFM words including 3 reversals: | 120 | words |
| EFM words including 4 reversals: | 70 | words |
| EFM words including 5 reversals: | 6 | words |

Consequently, the average number of reversals in one word is (4×1+56×2+120×3+70×4+6×5)/256=786/256 and is a little over approximately three times.

Here, as shown in FIG. 3, an EFM frame includes the sync pattern of 11T+11T+2T (in short, three reversals), and 3 margin bits disposed between EFM words of 14 bits.

Thus, if it is assumed that data to be EFM encoded are random numbers and the reversal occurrence probability at each margin bit is ½, then the average reversal number in one EFM frame is (786/256)×33+(½)×34+3≈121.32 (reversals)

It is to be noted that "33", is a word number as main data, a parity or a sub code, "34" is the number of margin bits, and "3" is the number of reversals of the sync pattern (refer to FIG. 3).

Consequently, the average frequency of the EFM signal is considered to be 121.32×7.35 [KHz]=891.1702 [KHz]

It is to be noted that, according to the format employed in ordinary CD systems, since PCM audio data to be EFM modulated do not make fully random numbers, therefore the average frequency of the EFM signal therein somewhat lacks in reliability occurs, but the PCM audio data generally present appropriate values.

Thus, in the present embodiment, based on 891.1702 KHz which is the average frequency of the EFM signal, 900 KHz is set as a maximum value of the CLV target value taking some margin on the higher frequency side into consideration.

On the other hand, where, for example, a silence pattern or a random pattern of −60 dB or less is included in the EFM signal, the average bit number per sample period is 2.27 bits, and the frequency of the EFM signal then is approximately 790 KHz and this is regarded as a minimum value which can be assumed theoretically.

Here, it is known that, if it is assumed that, for example, in order that the CLV target value may have some margin, taking it into consideration that two edge (two reversal) patterns (two reversals) are concentrated on lower values in EFM conversion, while the reversal number of symbols of each main data (refer to FIG. 3) is approximately 2.85 times in average, the reversal number only of each symbol of the main data is 2, then the frequency of the EFM signal holds approximately 750 KHz. Consequently, it can be considered that the center of the frequency of the EFM signal exists in the range of 900 KHz to 750 KHz. Accordingly, it is considered that the CLV velocity has a center velocity between 900 KHz and 750 KHz.

In accordance with the foregoing description, in the present embodiment, it is assumed that, as a sweep range of the CLV target value set by the CLV target setting circuit 35, the maximum value is set to 900 KHz and the minimum value is set to 750 KHz.

Where a CLV target variation setting circuit which functions in the normal mode is constructed with hardware, such as the CLV target setting circuit 35, it can be constructed, for example, in such a manner as shown in a block diagram of FIG. 9. It is to be noted that, while, in FIG. 9, also a construction of the CLV servo circuit system 25A shown in FIG. 4 is shown, this construction is similar to that of FIG. 4 and like reference numerals to those of FIG. 4 are applied to the components of the construction. Thus, overlapping description of such components is omitted here to avoid redundancy.

FIG. 9 shows a construction of a CLV target variation setting circuit 35A of the CLV target setting circuit 35 which operates only in the normal mode.

In the CLV target variation setting circuit 35A, a counter section 60 performs up/down counting of the CLV target value. A selector 61 selectively outputs one of the maximum value (900 KHz) and the minimum value (750 KHz) of the CLV target value held in a maximum value register 63 and a minimum value register 62, respectively. Further, a set/reset section 64 sets the counter section 60 when the count value of the counter section 60 becomes equal to the maximum value (900 KHz), but causes the counter section 60 to perform a resetting operation when the count value becomes equal to the minimum value (750 KHz) or an edge of a load signal LD is detected.

To a set input terminal of the set/reset section 64, a detection output of a maximum value detection section 65 which detects that the count value (CLV target value) of the counter section 60 becomes equal to the maximum value is inputted. Meanwhile, to a reset input terminal, a result of logical OR of an OR gate 68 to which a detection output of a minimum value detection section 66 which detects that the count value of the counter section 60 becomes equal to the minimum value and another detection output which represents an edge of a load signal detected by an edge detection circuit 67 is inputted.

The control signal SC1 to be supplied to the CLV target variation setting circuit 35A is the load signal LD or the lock signal S·LOCK.

For example, if the load signal LD is supplied from the system controller 14 to the counter section 60, then the counter section 60 loads a counting initial value and starts its counting operation. While the initial value here may be set arbitrarily between the range of the maximum value (900 KHz) and the minimum value (750 KHz), if, for example, the maximum value is set as the initial value, then the CLV target value of 900 KHz is loaded and down counting is started toward a target value for which the minimum value 750 KHz is used. The counting is performed, for example, at a timing synchronized with the frequency signal FS of RFCK/64. In short, though not shown in FIG. 9, as a timing clock for allowing the counter section 60 to perform counting, for example, the frequency signal FS is supplied.

Here, if it is assumed that the down counting operation by the counter section 60 is continued until the minimum value (750 KHz) is reached, then the minimum value detection section 66 outputs a detection signal representing detection of the fact that the CLV target value has become equal to the minimum value, and a reset signal is outputted from the set/reset section 64. Consequently, the counter section 60 changes over its operation to an operation of performing up counting toward a counting target value provided by the maximum value (900 KHz). It is to be noted that, also at a timing at which reversal of the load signal is obtained, the counter section 60 is reset and changes its operation to up counting.

Then, if it is assumed that the up counting operation of the counter section 60 is continued until the maximum value (900 KHz) is reached, then the maximum value detection section 65 outputs a detection signal representing that the CLV target value has become equal to the maximum value. Consequently, a set signal is outputted from the set/reset section 64, and consequently, the counter section 60 changes over its operation to down counting operation toward a count target value provided by the minimum value (750 KHz).

The counter section 60 varies the CLV target value within the range from the maximum value to the minimum value held in the maximum value register 63 and the minimum value register 62 in such a manner as described above until the lock signal S·LOCK (outputted from the system controller 14) of the H level is inputted to an enable negated input terminal thereof, in short, until a condition wherein the PLL circuit is put into a locked state. Then, if the PLL circuit is confirmed to be put into a locked state and the lock signal S·LOCK of the H level is inputted to the enable negated input terminal, then the counter section 60 stops its counting operation and holds a count value (CLV target value) to output then.

The foregoing operations are performed in the CLV scanning mode in the normal mode which is described below.

It is to be noted that, in the construction described above, changing over between up counting and down counting of the counter section 60 may possibly be performed based on a result of measurement of the EFM pit length. For example, mode changing over between up counting and down counting of the counter section 60 may be performed based on a result of comparison with a required reference value of a result of measurement of the pit length of a pattern of 11T (maximum reversal interval) which is measured by an EFM pit length measurement circuit not shown.

2-c. Operation in Normal Mode

Subsequently, operation in the normal mode of the PLL/CLV servo circuit 25 having the construction described above is described. The normal mode is an ordinary reproduction mode in which no shock proof function is provided to the CD player as described hereinabove, and in a steady state, the disk 1 is controlled so as to be driven to rotate at a CLV of a one-tuple velocity while writing of data at a high rate and read-out control at a steady velocity utilizing the RAM 9 are not performed.

In the normal mode, in the PLL/CLV servo circuit 25 shown in FIG. 4, the switch SW2 is connected at the terminal T·N with the mode change-over signal S·NW outputted from the system controller 14. Consequently, the PLL target fixed value held in the PLL target fixed value register 40 is supplied to the subtractor 46. Meanwhile, the switch SW5 is controlled so as to be switched off with the mode change-over signal S·NW so that operation of the PCI circuit 50 is invalidated.

Here, for example, upon starting of the spindle motor, or when the PLL circuit remains in a non-locked condition for more than a predetermined time because of a failure in servo or a dropout caused by dust on or damage to the disk 1 or the like, the CLV scanning mode for causing the PLL circuit to be locked so that a reproduction operation may be performed is entered.

Since, in this stage, the PLL circuit is not locked as yet, each of the switches SW1 and SW3 which are controlled with the lock signal S·LOCK is controlled so that the terminal Tout is connected to the terminal T·UL thereof. Accordingly, the value of '0' is inputted as the signal CLV-P to the adder 36 of the CLV servo circuit system 25A, and in the PLL circuit system 25B, the automatic adjustment circuit system for the VCO central frequency of the FCO counter 45 side is validated.

Since the switching conditions of the individual switches are controlled in such a manner as described above, in an initial state in the CLV scanning mode, the CLV servo circuit system 25A side enters the automatic adjustment mode for adjusting the VCO 44 with the central frequency. In short, since the switch SW4 is off, the error control signal S·E obtained based on the detection output of the analog PCO circuit 41 is prevented from being supplied to the adder 43. Then, since the terminal T·UL of the switch SW3 is connected to the terminal Tout, the output of the automatic adjustment circuit system which includes the FCO counter 45 is supplied to the VCO 44 through the adder 43.

As an operation of the PLL circuit system 25B then, the FCO counter 45 uses the frequency signal FS (RFCK/64) of the crystal element as a reference clock to measure the frequency value of the frequency signal PLCK/36 obtained based on the oscillation frequency of the VCO 44, and the subtractor 46 compares a result of the measurement with the PLL target fixed value (output of the PLL target fixed value register 40). Then, the output of the subtractor 46 is supplied as the frequency error signal S·FC to the adder 43 through the amplifier 47→switch SW3→integration circuit 48→D/A converter 49.

In this instance, if it is assumed for simplified description that the training mode is set, the output of the analog PCO circuit 41 is not supplied to the adder 43, the VCO 44 is controlled only by the loop, by which the frequency error signal S·FC on the FCO counter 45 side is fed back, so that the frequency signal PLCK/36 may approach the PLL target fixed value. Consequently, the oscillation frequency of the VCO 44 is controlled so that it is converged and fixed to the central frequency (PLCK=4.3218 MHz) set corresponding to the normal mode. In short, in the CLV scanning mode in the normal mode, it can be considered that the PLL circuit system 25B is in a condition wherein the VCO 44 is fixed at the central frequency.

In contrast, in the CLV servo circuit system 25A, when the velocity information signal outputted from the CLV velocity counter 33 is compared with the CLV target value outputted from the CLV target setting circuit 35 by the subtractor 34, the CLV target setting circuit 35 varies the CLV target value. In short, the CLV target setting circuit 35A performs the operation described with reference to FIG. 9 to vary the CLV target value so that it may sweep within the range between the maximum value (900 KHz) and the minimum value (750

KHz) until the CLV target variation setting circuit 35A described hereinabove with reference to FIG. 9 functions and a condition wherein the PLL circuit is locked (lock signal S·LOCK=H) are established.

Accordingly, the rotational velocity of the spindle motor 2 is controlled so that the frequency of the EFM signal comes within the pull-in range of the PLL circuit based on velocity error information obtained from a difference of the CLV velocity information (output of the CLV velocity counter 33) at present from the varied CLV target value.

It is to be noted that, since the switch SW1 is connected to the terminal T·UL then, in the CLV scanning mode, the phase error signal CLV-P which is unnecessary as a control component is not supplied to the adder 36, but the value '0' is supplied.

Here, if the rotational speed of the spindle motor 2 comes to a level corresponding to the pull-in range of the PLL circuit to allow detection of the frame sync of the EFM signal and the lock signal S·LOCK of the H level is outputted from the system controller 14, then the "ordinary operation mode" in which the condition wherein the PLL circuit is locked is kept is entered. Then, once the ordinary operation mode is entered, then the CLV target value which has been varied by the counter section 60 of the CLV target setting circuit 35 is fixed at this point of time and is set as a CLV target value which is to be used later for CLV control in the ordinary operation mode. By such operation as described above, the CLV servo circuit system in the present embodiment can be constructed so that only one transmission characteristic can always be obtained.

Further, since the lock signal S·LOCK is put into the H level, the switch SW1 in the CLV servo circuit system 25A is switched to the terminal T·L. Consequently, the phase error signal CLV-P at present is inputted to the adder 36 and added to the velocity error signal CLV-S at present. Then, the spindle motor 2 is CLV controlled with a motor driving signal obtained based on the adder 36.

Further, when the "ordinary operation mode" is entered, the switch SW3 in the PLL circuit system 25B is switched from the terminal T·UL to the terminal T·U with the lock signal S·LOCK (H level). However, in the normal mode, since the switch SW5 is off, the output of the PCI circuit 50 is off, and accordingly, the input to the integration circuit 48 is open. Consequently, in the ordinary operation mode, the integration value (last value in the scanning mode) which has been held by the integration circuit 48 at the point of time when the PLL circuit was locked is held and inputted as the frequency error signal S-FC to the adder 43.

In this instance, since the switch SW4 is on except when the training mode is set, also the error control signal S·E obtained based on the phase comparison output of the analog PCO circuit 41 is inputted to the adder 43. Consequently, the PLL circuit system 25B in the ordinary operation mode controls the oscillation frequency of the VCO 44 with a voltage value obtained by adding the frequency error signal S·FC to the error control signal S·E to maintain the locking condition.

In this manner, in the present embodiment, in the CLV scanning mode in the normal mode, as operation for pulling in the CLV velocity to a velocity corresponding to the capture range of the PLL circuit, the CLV velocity is measured by counting the number of edges (number of reversals) of the EFM signal in a period of approximately 115 Hz (≈9 ms) which is longer than that of a related art CLV servo circuit system, and CLV control is performed based on an error between the measurement value and the CLV target value which is varied between the maximum value and the minimum value set based on the frequency of the EFM signal.

Consequently, in the present embodiment, ordinary CLV control can be entered from CLV pull-in servo with a very simple circuit scale without providing a rough servo circuit system separately as in the related art. Further, there is no necessity to change over the circuit system among rough serve control, access control and CLV control in ordinary reproduction as in the related art, and CLV control is performed always by a single circuit system. Consequently, CLV servo control which is stable as much is realized.

Further, for example, while the measurement period of the CLV velocity in the related art is approximately 136 $\mu$s, in the present embodiment, it is 9 ms as described above. In this instance, since the period is approximately 64 times longer, the disorder of a signal when one sample drops can be reduced to $\frac{1}{64}$. Further, since transition from the condition wherein the CLV target value is variable occurs and a CLV target value conforming to the ordinary operation mode is set, although the CLV target value is variable, it can be finally decided to one CLV target value. Accordingly, even a case wherein, for example, a construction wherein variable velocity reproduction is performed is employed can be achieved readily by the PLL/CLV servo circuit of the present embodiment.

Further, in the present embodiment, since the measurement value of the CLV velocity is based on the number of edges of the EFM signal, for example, if the system controller 14 supervises the measurement value, it is possible to construct such that, at a stage before a crush or reverse rotation of the disk occurs, a sign of such crush or reverse rotation is to be detected. Thus, it is possible to perform control by which an error condition arising from a crush, reverse rotation or the like of the disk can be prevented before they occur, which has been difficult in the related art.

For example, where the error of the CLV velocity value measured by the CLV velocity counter 33 from the CLV target value exceeds a predetermined range (for example, ±50%), kick control of the spindle motor is performed with a kick level set in advance until the error of the CLV velocity value from the CLV target value comes into a certain range (for example, ±30). Then, if it is detected that the error has come into the range, then control for returning to steady reproduction is performed.

2-d. CLV Target Variation Setting Operation by Software

It is also possible to realize the construction for varying the CLV target value in the CLV scanning mode in the normal mode with software which is based on control of the system controller 14 in place of hardware as described hereinabove with reference to FIG. 3, such as a CLV target variation setting circuit 35A. In this instance, for example, the CLV target value generated by the system controller 14 should be inputted to the subtractor 34 while the CLV target variation setting circuit 35A is omitted.

Figure 10:
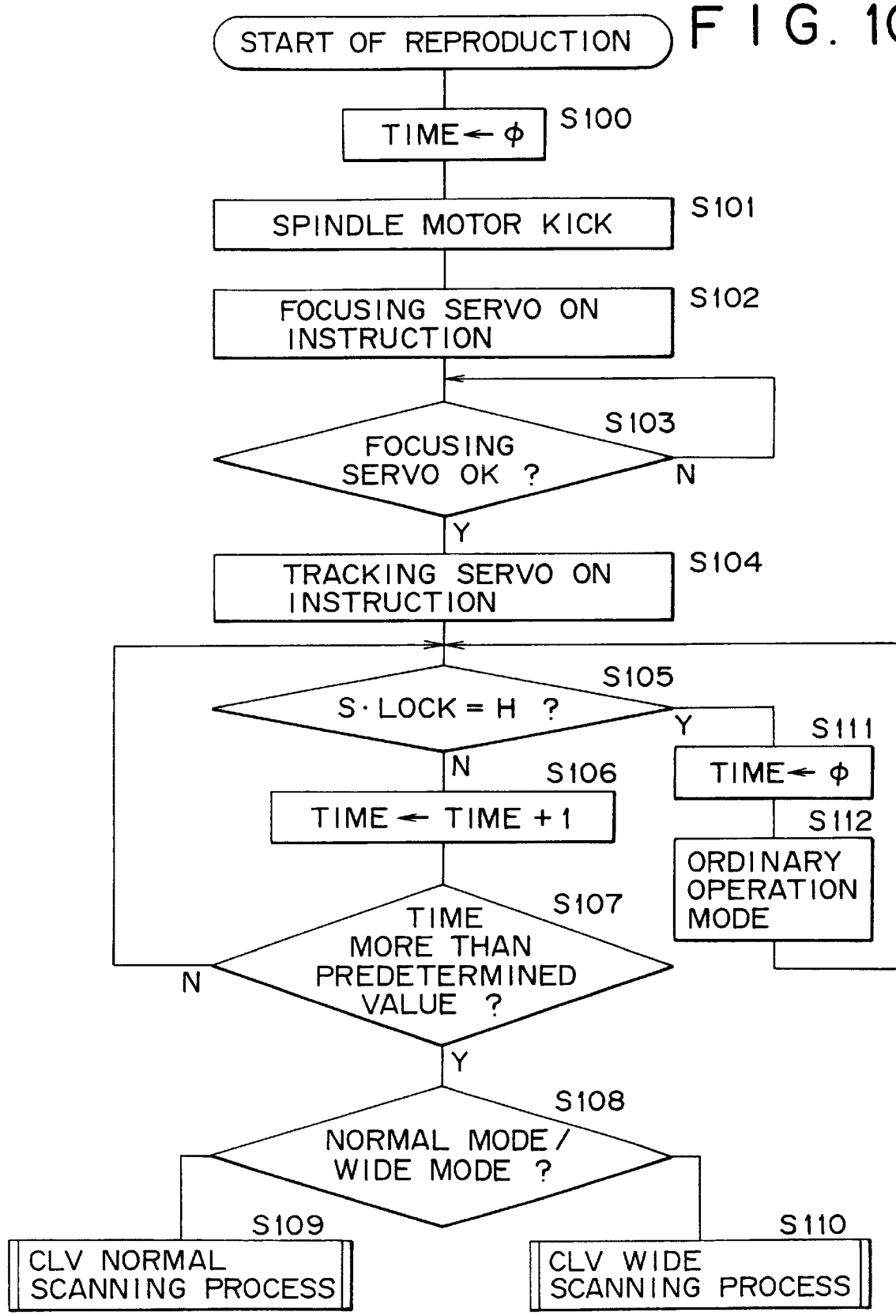
FIG. 10 is a flow chart illustrating several servo controls performed by the disk reproduction apparatus of FIG. 2 when a reproduction starting instruction is received.
Figure 11:
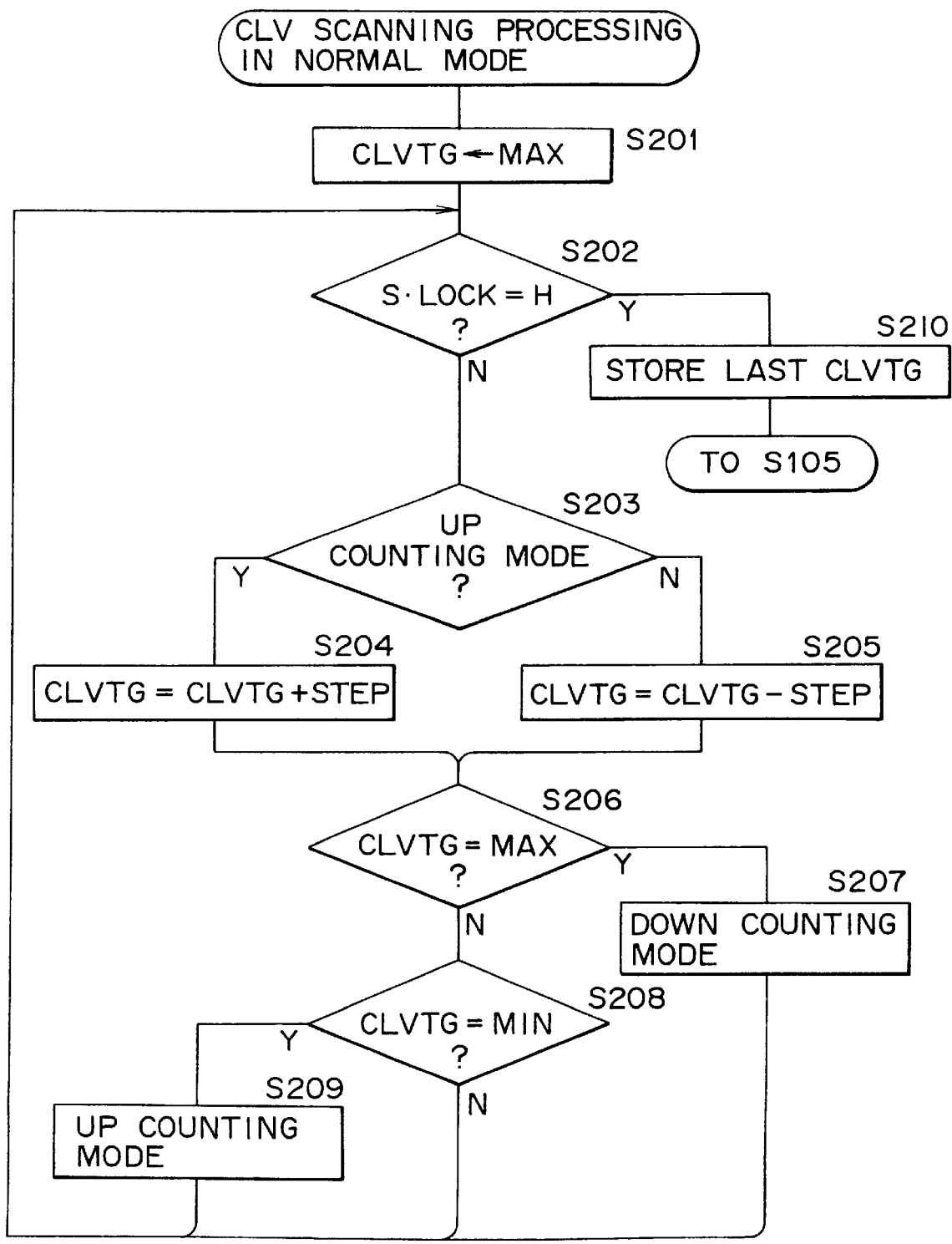
FIG. 11 is a flow chart illustrating a procedure of CLV scanning processing in a normal mode performed by the disk reproduction apparatus of FIG. 2.

Thus, a construction wherein the CLV target value is varied by software as operation in the CLV scanning mode in the normal mode is described with reference to flow charts of FIGS. 10 and 11. The processing operation illustrated in FIGS. 10 and 11 is executed by the system controller 14. Further, later processing operation is described taking a case wherein the spindle motor 2 is started to rotate as a situation for entering the CLV scanning mode as an example.

For example, if it is detected that an operation for reproduction of a disk has been performed on the operation section 15 from a stopping condition of the disk, then the system controller 14 advances its control to step S100 illustrated in FIG. 10, in which it resets a time measurement value TIME of an internal timer to 0. Then in step S101, the system controller 14 performs control for applying a kick voltage of a predetermined level for compulsorily driving the spindle motor 2 to rotate for a predetermined time. In short, an operation called spindle kick is performed, and as a result of the operation, the spindle motor 2 starts its rotation. It is to be noted that, after the execution of the spindle kick for the predetermined time is completed, for example, the spindle motor 2 is in a condition wherein its inertial rotation continues for a waiting time until CLV control is applied.

After the processing in step S101 is completed, the system controller 14 outputs a command for switching the focusing servo on in step S102. Consequently, the focusing servo circuit system which includes the optical system servo circuit 12 (refer to FIG. 2) executes focusing control until focusing servo loop control is entered from focusing search control. In this condition, the system controller 14 performs, in step S103, discrimination of whether or not a condition wherein focusing servo control is performed appropriately. If it is discriminated that a condition wherein servo control by the closed focusing servo loop is executed has been entered, then the control advances to step S104. In step S104, the system controller 14 outputs a command for turning tracking servo on. Consequently, the tracking servo circuit system in the optical system servo circuit 12 starts tracking servo control. Consequently, a condition wherein read-out of a signal recorded on the disk 1 can be performed by the optical head 3 is established.

In step S105, the system controller 14 discriminates whether the lock signal S·LOCK is outputted as the H level, that is, whether or not the PLL circuit is in a locked condition. It is to be noted that, if the PLL circuit has not been put into a locked condition, that is, if the lock signal S·LOCK=L, in the stage of processing till then, the circuit form of the PLL circuit system 25B is formed in such a condition that it performs an automatic adjustment operation of the VCO central frequency in which the circuit system of the FCO counter 45 is utilized as described with reference to FIG. 4.

If it is discriminated in step S105 that the rotational speed of the spindle motor 2 rotated by the preceding spindle kick processing (S101) is within the appropriate range corresponding to the capture range of the PLL circuit and the PLL circuit is already in a locked condition and the lock signal S·LOCK is S·LOCK=H, then the control advances to step S111, in which the time measurement value TIME is reset to '0', whereafter the control advances to step S112.

In step S112, control processing for a reproduction operation is executed in accordance with the ordinary operation mode under the condition that the PLL circuit is locked, and the control returns to step S106 after each predetermined time to supervise the state of the PLL circuit. It is to be noted that the discrimination processing of the locked condition of the PLL circuit in step S105 and step S202 which will be hereinafter described can be performed also by detecting the condition of, for example, the signal GFS inputted from the synchronism detection circuit 26 since the lock signal S·LOCK is produced in accordance with the signal GFS as described hereinabove.

Accordingly, as far as the PLL circuit is locked, the ordinary operation mode in accordance with the reproduction mode is continued by the loop processing of the steps S111→S112→S105 irrespective of whether or not the current mode is the normal mode or the wide mode.

On the other hand, if an error condition such as a failure in servo or a drop of a signal for a long period is caused by some disturbance or the like during reproduction and puts the PLL circuit out of a locked condition, then the control advances from step S105 to step S106.

If it is discriminated in step S105 that the PLL circuit is not locked, then the processing in the steps S106→S107→S105 is executed within a predetermined number of times. If the PLL circuit returns to its locked condition as a result of the processing by the predetermined or less number of times and enters the ordinary operation mode, then the value TIME is reset to 0 in step S11, whereafter the control advances to step S112. On the other hand, if, even after the processing described above is performed by a number of times larger than the predetermined number of times, the rotational speed of the spindle motor 2 still remains inappropriate and the PLL circuit is not locked, making it impossible to enter the ordinary operation, then the control advances from step S107 to step S108. In step S108, it is discriminated which one of the normal mode and the wide mode is set as the reproduction mode for the CD player at present. The mode setting is considered to have performed by a user who operates the operation section 15 to select one of the two modes.

If it is discriminated in step S108 that the current reproduction mode is the normal mode, then processing in the CLV scanning mode corresponding to the normal mode is performed in step S109. The processing routine in step S109 is described below with reference to FIG. 11.

On the other hand, if it is discriminated that the current reproduction mode is the wide mode, then processing for the CLV scanning mode in the wide mode in step S110 is performed. The processing routine in step S110 is hereinafter described.

In the routine illustrated in FIG. 11, operation is performed by the system controller 14 in place of the CLV target variation setting circuit 35A described above with reference to FIG. 9. Here, it is assumed that information at least of the maximum value (900 KHz) and the minimum value (750 KHz) of the CLV target value is set in advance in the system controller 14.

In the processing illustrated in FIG. 11, for example, a CLV target value (denoted at CLVTG in FIG. 11) to be inputted to the subtractor 34 is set to the maximum value first in step S201. Then in step S202, discrimination of whether or not the PLL circuit is locked is performed.

If it is discriminated in step S202 that the PLL circuit is locked, then the control advances to step S210, in which the last CLV target value when the variation control of the CLV target value is stopped and the PLL circuit is locked is stored, whereafter the control advances to step S105 illustrated in FIG. 10. Consequently, as far as the PLL circuit remains in a locked condition, the operation of the ordinary operation mode is performed by the loop processing of the steps S111→S112→S105.

On the other hand, if it is discriminated in step S202 that the PLL circuit is not locked, then the control advances to step S203, in which it is discriminated whether or not the counting mode of the VCL target value is the up counting mode at present. It is to be noted that, if the control advances to step S203 after performing the processing in the steps S201 →S202, then it is considered that the down counting mode is set.

If it is discriminated in step S203 that the counting mode of the VCL target value is the up counting mode, then the control advances to step S204, in which the CLV target value is incremented by one step, whereafter the control advance to step S206. On the other hand, if it is discriminated that the counting mode is the down counting mode, then the CLV target value is decremented by one step in step S205, whereafter the control advances to step S206.

In step S206, it is discriminated whether or not the CLV target value at present is the maximum value. If the CLV target value at present is the maximum value, then the control advances to step S207, in which the counting mode is changed over to the down counting mode, whereafter the control returns to step S202. On the other hand, if it is discriminated that the CLV target value has not reached the maximum value, the control advances to step S208, in which it is discriminated whether or not the CLV target value has reached the minimum value. Then, if it is discriminated that the CLV target value has reached the minimum value, then the control advances to step S209 so that the control returns to step S202 after changing over to the up counting mode is performed. On the other hand, if a negative result is obtained in step S208, then the control returns to step S202 while the counting mode till then is maintained.

As the operation described above is executed, operation equivalent to the CLV target variation setting circuit 35A described with reference to FIG. 3 is executed as processing of the system controller 14.

It is to be noted that, in the processing operation described above, it is possible for changing over between the up counting mode and the down counting mode to be performed based on a result of measurement of the EFM pit length in conformity with the construction as hardware described with reference to FIG. 9.

2-e. Operation in Wide Mode

Subsequently, operation of the PLL/CLV servo circuit 25 in the shock proof mode (wide mode) is described supplementarily. In the shock proof mode, read-out of a signal from a disk, signal processing in the signal processing circuit 7 and writing of data into the RAM 9 are performed at a particular data transfer rate basically higher than a one-tuple rate to accumulate data into the RAM 9, and read-out of the data from the RAM 9 is performed at an ordinary rate corresponding to the one-tuple rate so that reproduction data may be outputted without being interrupted, thereby achieving a shock proof function. Then, in the present embodiment, in order to further reinforce the shock proof function, as operation of the PLL/CLV servo circuit 25, operation for the "wide mode" is performed so that the expansion of the capture range and the lock range of the PLL circuit may be achieved as described below.

In this instance, the lead frame clock signal RFCK is formed as a frequency signal represented by RFCK=n× RFCK in a corresponding relationship to the fact that the CLV velocity is set to the n-tuple velocity (n>1). Further, corresponding to this, also the oscillation frequency of the VCO 44 is set so as to have a frequency with regard to that in the normal mode. Accordingly, also the frequency of the signal PLCK in the wide mode is represented as PLCK=n× PLCK.

As switching conditions of the switches in the wide mode, the switch SW2 is switched to the terminal T·W side with a mode change-over signal S·NW corresponding to the wide mode. Consequently, the output of the PLL target variation circuit 39 is inputted to the subtractor 46 of the PLL circuit system 25B. In short, in the automatic adjustment circuit system for the central frequency of the VCO 44 of the PLL circuit system 25B, information of the EFM signal frequency measured by the CLV velocity counter 33 is supplied as a PLL target value to the subtractor 46.

Besides, the switch SW5 is controlled so as to be switched on with the mode change-over signal S·NW corresponding to the wide mode to enable the output of the PCI circuit 50 to be supplied to the terminal T·L of the switch SW3.

Meanwhile, the switching conditions of the switches SW1 and SW4 which are controlled with the lock signal S·LOCK are similar to those in the normal mode.

Further, in the wide mode, in the CLV servo circuit system 25A, the CLV target value of the predetermined fixed value is outputted from the CLV target setting circuit 35 to the subtractor 34. In short, even in a CLV scanning operation which will be hereinafter described, the CLV target value is not variably controlled as in the normal mode. Consequently, in the wide mode, in the CLV servo circuit system 25A, the rotational speed of the spindle motor 2 is controlled so that a converged condition wherein the CLV velocity information outputted from the CLV velocity counter 33 coincides with the CLV target value of the fixed value described above may be obtained.

Further, when the PLL circuit is not locked in the wide mode, the phase error signal CLV-P of the fixed value of '0' is inputted to the adder 36.

On the presumption that such a circuit form as described above is formed in the PLL/CLV servo circuit 25, a CLV scanning operation of the CLV servo circuit system 25A, which is operation for locking the PLL circuit, in the wide mode is described hereinafter.

Here, for example, as a condition wherein the PLL circuit is not locked, when the rotational speed of the disk does not reach the fixed value set by the CLV target setting circuit 35, in the PLL circuit system 25B, automatic adjustment operation of the central frequency for controlling the VCO 44 to converge to the central frequency is performed only by the loop in which the frequency error signal S·FC on the FCO counter 45 side is fed back.

However, in the wide mode, the PLL target value to be compared with the output of the FCO counter 45 by the subtractor 46 is the output of the PLL target variation circuit 39 as described hereinabove. In this instance, the PLL target variation circuit 39 receives the EFM signal frequency value of the CLV velocity counter 33 and varies the PLL target value, for example, in a period of RFCK/64 in accordance with the ratio between the predetermined aimed value aimed at by the output of the FCO counter 45 and the CLV target value. It is to be noted that the variation operation of the PLL target value is hereinafter described.

The PLL target value to be aimed at with respect to the frequency measurement value of the FCO counter 45 is a frequency value based on the EFM signal frequency value at present as described above, and the oscillation frequency of the VCO 44 is controlled with the frequency error signal S·FC produced based on the PLL target value. Consequently, the VCO 44 is converged so as to be fixed to a VCO frequency which can be locked to the EFM signal frequency value at present or a minimum frequency which depends upon the characteristics of the D/A converter 49, adder 43 and VCO 44. Meanwhile, the CLV servo circuit system 25A performs an operation of controlling the rotational speed of the spindle motor 2 using the CLV target value of a fixed value as an aimed value. In this instance, the PLL circuit system 25B performs automatic adjustment operation of the central frequency of the VCO described above and waits until the rotational speed of the spindle motor 2 rises before the PLL circuit is locked.

The operation condition upon unlocking described above can be regarded as a condition wherein the oscillation frequency of the VCO 44 is controlled so as to approach, for example, the disk rotational speed at present.

Consequently, for example, if it is assumed that the frequency variation range of the frequency signal PLCK obtained by ½ division of the oscillation frequency of the VCO 44 ranges from 2 MHz to 30 MHz, then in the present embodiment, the PLL circuit is locked to enable reading of a signal at a point of time when 2 MHz which is the minimum frequency of the signal PLCK is obtained. In other words, follow-up by the PLL circuit is possible from the pulling up stage of CLV servo.

For example, if it is assumed that a reproduction operation at a double velocity is performed, then since the PLL circuit is not put into a locked state until the frequency of the signal PLCK reaches 4.3218 MHz×2, a time of approximately 4 seconds is required in the related art, for example, until signal reading is enabled after rotation of the spindle motor 2 is started. In contrast, with the present embodiment, reading of a signal is enabled in approximately one second.

Further, also when the PLL circuit is to be re-locked, for example, upon track jumping, as the CLV scanning operation described above is executed, the PLL circuit can be converged so as to follow the disk speed approximately 100 times as high as the related art one. This arises from the fact that, while only the rotational speed of the spindle motor 2 is a variably controllable factor in the related art since the PLL target value is fixed, in the present embodiment, the oscillation frequency of the VCO 44 is controlled so as to follow the speed of the spindle motor 2 at present corresponding to the EFM signal frequency by operation of the central frequency automatic adjustment system of the PLL circuit.

If transition from a condition wherein the PLL circuit is not locked to another condition wherein the PLL circuit is locked as the EFM signal frequency coincides with the PLCK period and the frame sync is detected appropriately by the synchronism detection circuit 26 is performed in such a manner as described above, then the lock signal S·LOCK to be outputted from the system controller 14 is outputted with the H level.

Consequently, the switch SW3 is switched from the terminal T·UL to the terminal T·L. Further, the switch SW4 is switched on. It is to be noted that the switch SW1 is fixed, in the wide mode, at the terminal T·UL (fixed value '0' side).

Consequently, CLV control of the spindle motor 2 by the CLV servo circuit system is performed based on the velocity error signal CLV-S continuously from that in the unlocking condition.

Meanwhile, in the PLL circuit system 25B, the signal to be outputted to the integration circuit 48 through the switch SW3 is switched from the FCO counter 45 side to the wide locking circuit system of the PCI circuit 50 side. Further, the error control signal S·E obtained based on the detection output of the analog PCO circuit 41 is supplied to the adder 43 through the switch SW4.

In a condition wherein the PLL circuit is locked, the phase error signal S·PC obtained by integrating the detection output of the phase error low frequency components of the PCI circuit 50 by means of the integrating circuit 48 corresponds to frequency error information of the EFM signal with respect to the frequency signal PLCK. Consequently, at a point of time when the output of the switch SW3 is switched from the FCO counter 45 side to the system of the PCI circuit 50 side, a condition wherein the last value of the frequency error signal S·FC which has been supplied from the FCO counter 45 side till then is succeeded by the phase error signal S·PC is obtained.

After the PLL circuit is put into a locked state by the operation described above, the oscillation frequency of the VCO 44 is controlled with a voltage value obtained by addition by the adder 43 of the phase error signal S·PC obtained through the D/A converter 49 based on the output of the wide locking circuit system of the PCI circuit 50 side and the error control signal S·E which is a detection output of the analog PCO circuit 41.

In this instance, the phase error signal S·PC (output of the D/A converter 49) obtained based on the output of the PCI circuit 50 is a phase low frequency component having an action to determine the central frequency of the VCO 44 so as to follow the EFM signal frequency. On the other hand, the phase comparison result which is the detection output of the analog PCO circuit 41 on which the error control signal S·E is based is a phase high frequency component. Accordingly, only the characteristics of the D/A converter 49 and the adder 43 and the frequency variation range of the VCO 44 serve as the factors which determine the lock range and the capture range in the PLL circuit system 25B. As a result, the lock range and the capture range can be expanded to ranges limited by the determination factors mentioned above.

Here, in FIGS. 13A to 13C, operation of the PLL/CLV servo circuit 25 in the wide mode described above is illustrated in relation to the CLV control signal, which is a driving output to be supplied from the CLV servo circuit system 25A to the motor driver, the frequency error signal S·FC/phase error signal S·PC and the lock signal S·LOCK.

For example, it is assumed that an operation for starting rotation of the spindle motor 2 is started at time t0. In this instance, since the PLL circuit is not locked, the lock signal S·LOCK exhibits the L level as seen from FIG. 13C. In this condition, in the PLL servo circuit system 25A, only the system on the FCO counter 45 side operates, and the VCO oscillation frequency is controlled, for example, with the frequency error signal S·FC illustrated in FIG. 13B. Further, in this initial stage, since the rotational speed of the spindle motor 2 is considerably different from the CLV target value, a CLV control signal of a comparatively high level as seen in FIG. 13A is supplied to raise the disk rotational velocity high.

After time t0, the operation for the CLV scanning mode described above is performed, and if the PLL circuit is put into a locked condition, then the lock signal S·LOCK illustrated in FIG. 13C changes to the H level. Consequently, as described hereinabove, the PLL circuit system 25A operates so as to perform changing over from a condition wherein the system of the FCO counter 45 side is valid to another condition wherein the system of the PCI circuit 50 side is valid. Then, as shown in FIG. 13B, the signal to be inputted to the adder 43 is changed over to the phase error signal S·PC in such a manner as to take over the last value of the frequency error signal S·FC.

Thereafter, as being seen from the level transitions of the CLV signal of FIG. 13A and the phase error signal S·PC of FIG. 13B, CLV control is performed so that coincidence with the CLV target value of the CLV servo circuit system 25A may be reached while the PLL circuit system 25B is controlled so that the oscillation frequency of the VCO 44 may be equal to the central frequency of the steady state while the locked condition is maintained.

For example, where operation for the wide mode of the PLL circuit system 25B which does not include the wide lock system including the PCI circuit 50 of the present embodiment is considered, the pull-in control operation is performed based on the frequency error signal S·FC obtained by the system of the FCO counter 45 side. Thus, expansion of the capture range is realized by the operation described above.

However, since the output (S·E) of the analog PCO circuit 41 and the detection output (S·PC) of the FCO counter 45 side have different phases, where the PCI circuit 50 is not provided, when the PLL circuit is locked, only a method of storing the last value of the frequency error signal S·FC, which is the detection output of the FCO counter 45 side, at a point of time when the PLL circuit s locked and adding the stored value of frequency error signal S·FC as an offset component to the error control signal S·E of the analog PCO circuit 41 can be taken. Since the frequency error signal S·FC in this instance is a fixed value and does not vary following the EFM signal frequency, expansion of the lock range is difficult.

In contrast, in the present embodiment, since the output obtained by the operation of the PCI circuit 50 is added to the output of the analog PCO circuit 41 as described above, the central frequency of the VCO 44 can be variably controlled so as to follow up the EFM signal frequency.

Subsequently, as processing operation of the system controller 14 in the wide mode described above, variable control processing of the PLL target value of the PLL target variation circuit 39 is described principally with reference to FIGS. 10 and 12.

Even in the wide mode, for example, as processing after starting of rotation of the spindle motor 2 or immediately after the locked condition of the PLL circuit is lost by a failure in servo, a dropout of a signal or the like, processing in steps S100 to S108 as processing operation illustrated in FIG. 10 is executed. It is to be noted that, since the processing operation illustrated in FIG. 10 is already described as operation in the normal mode, overlapping description of the same is omitted here to avoid redundancy. However, in the wide mode, since the CLV target value is fixed, the CLV servo circuit system is in a condition wherein CLV control is performed so as to achieve convergence to the CLV target value.

If it is discriminated in step S108 of FIG. 10 that the current mode is the wide mode, then the control advances to step S110, in which processing for the CLV scanning mode in the wide mode is executed.

Figure 12:
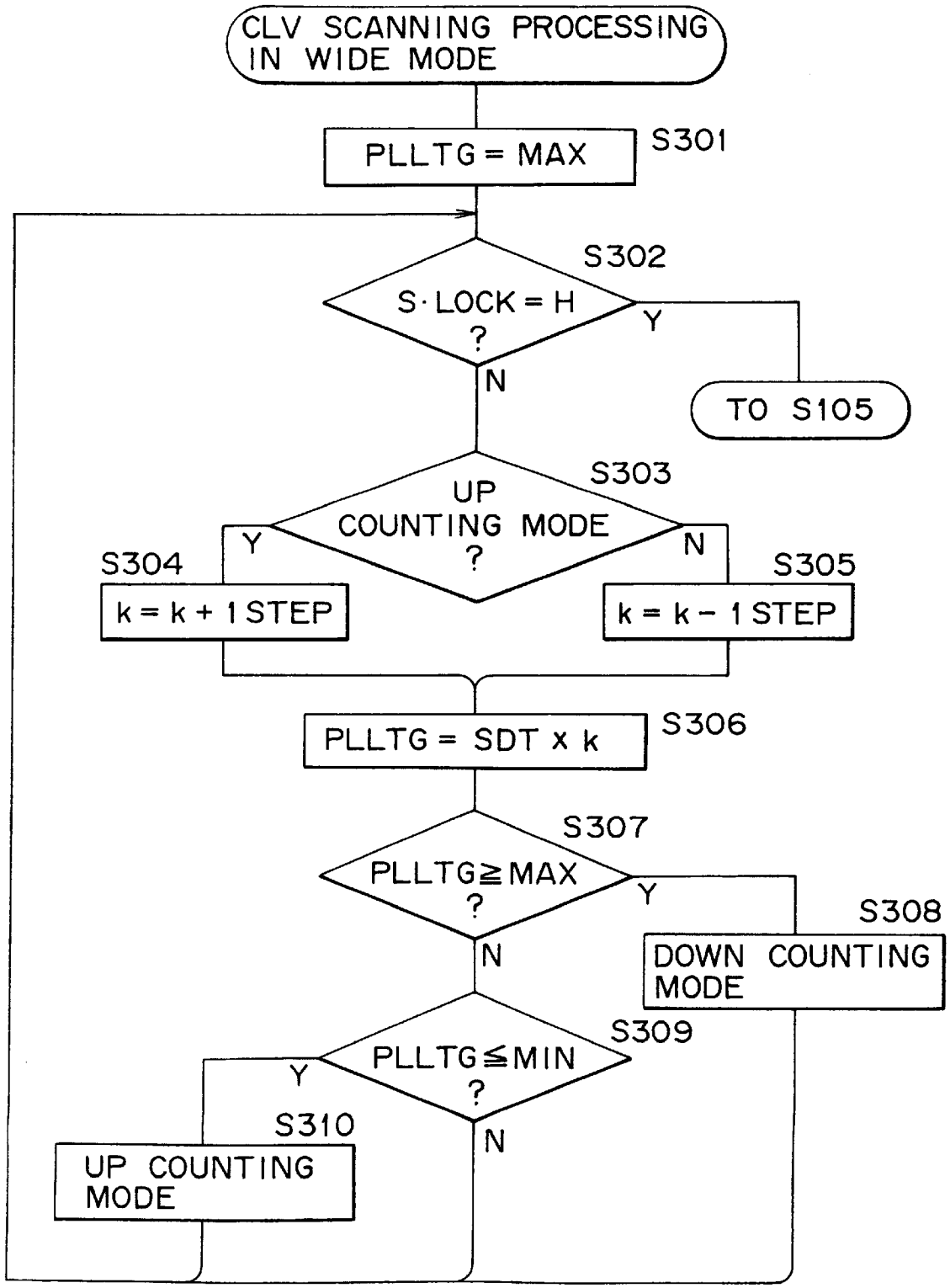
FIG. 12 is a flow chart illustrating a procedure of CLV scanning processing in a wide mode performed by the disk reproduction apparatus of FIG. 2.
Figure 14A:
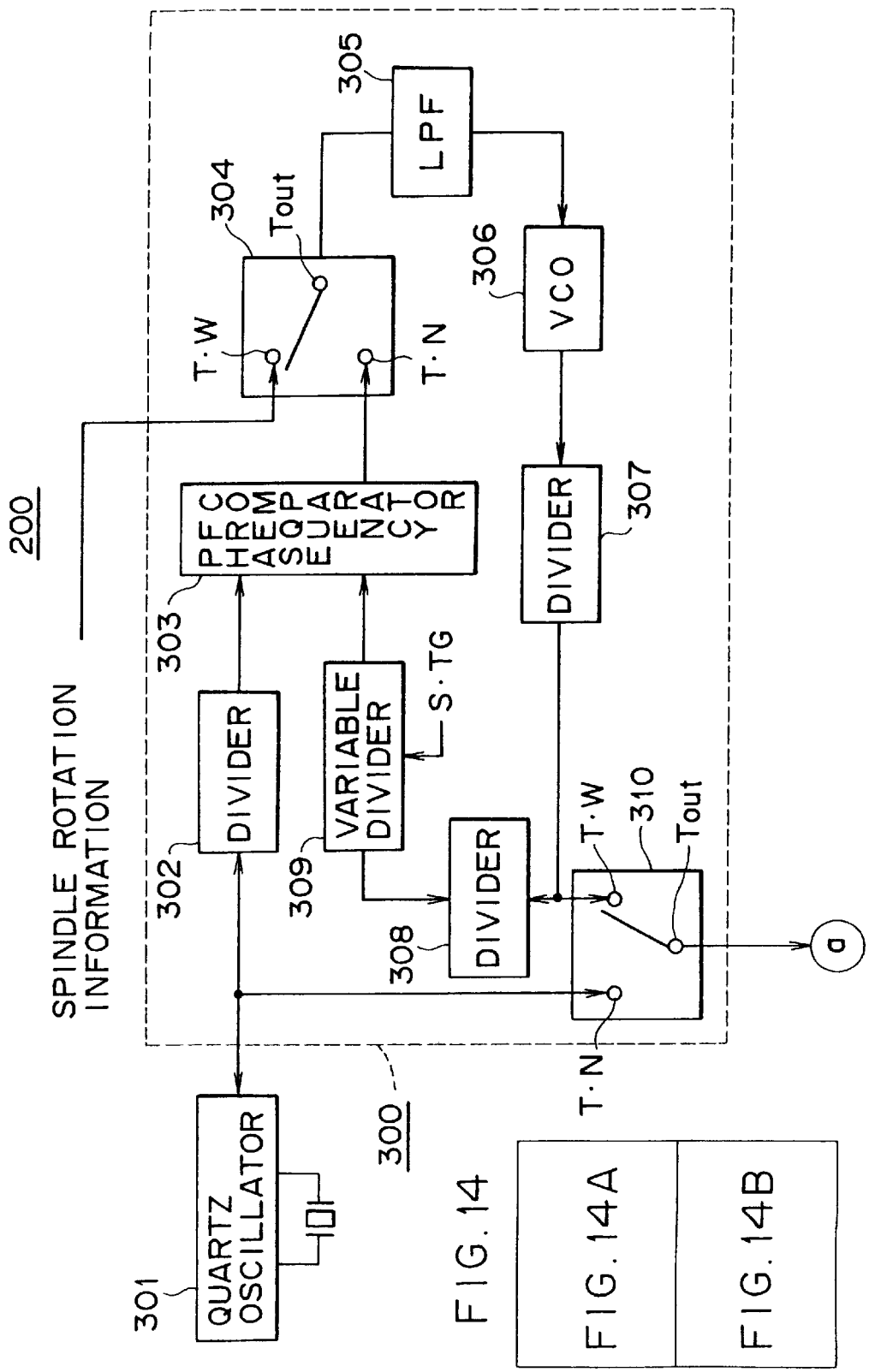
Figure 14B:
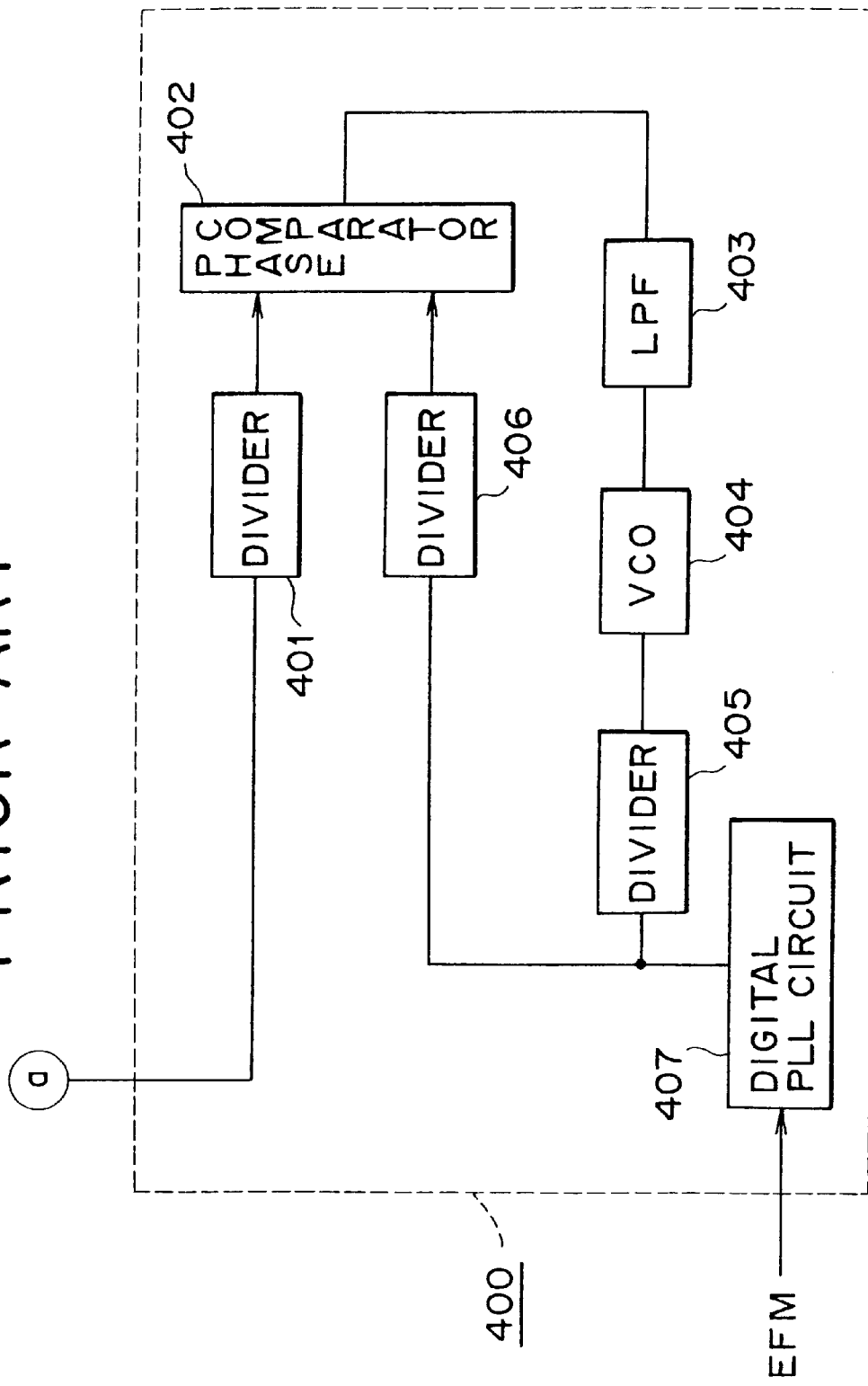

The CLV scanning processing in step S110 is such as illustrated in a processing routine of FIG. 12. In this s processing routine, the system controller 14 outputs a control signal SC2 to control the PLL target variation circuit 39 to vary the PLL target value to be outputted from the PLL target variation circuit 39 in such a manner as hereinafter described.

In the processing of the CLV scanning mode illustrated in FIG. 12, first in step S301, the PLL target value (denoted at PLLTG in FIG. 12) to be outputted from the PLL target variation circuit 39 is set to the maximum value.

The maximum value of the PLL target value is set by setting, for example, where the output value of the CLV velocity counter 33 inputted to the PLL target variation circuit 39 is represented by STD, a maximum value for a coefficient k by which the value SDT is multiplied.

Further, as the maximum value of the PLL target value, a value corresponding to 900 KHz which is the maximum value of the variation range of the CLV target value described hereinabove is set. Further, also as a minimum value of the PLL target value, 750 KHz which is the minimum value of the variation range of the CLV target value is set.

Thereafter, the system controller 14 performs, in step S302, discrimination of whether or not the PLL circuit is locked.

If it is discriminated in step S302 described above that the PLL circuit is locked, then the control advances to step S105 of FIG. 10. Consequently, as long as the PLL circuit remains in a locked condition, the ordinary operation mode is executed by the loop processing of the steps S111→S112→S105. It is to be noted that, in this instance, since the current mode is the wide mode, at a point of time when the control advances to step S105, in the PLL circuit system 25B, switching from the system of the FCO counter 45 side to the wide locking circuit system of the PCI circuit 50 is performed as described above.

On the other hand, if it is discriminated in step S302 that the PLL circuit is not locked, then the control advances to step S303, in which it is discriminated whether or not the counting mode of the PLL target value is the up counting mode at present. It is to be noted that, in the initial stage wherein the control advances to step S303 after performing the processing in steps S301→S302, the down counting mode is set.

If it is discriminated in step S303 that the counting mode is the up counting mode, then the control advances to step S304, in which an up counting operation is performed.

In this up counting operation, for example, as seen from FIG. 12, the coefficient k to be used for variation calculation of the PLL target value is incremented by one step of a predetermined value in step S304. Then, in next step S306, the coefficient k obtained in step S305 is used to perform multiplication of the output value SDT of the CLV velocity counter 33. In short, up counting is performed by executing the processing of updating the PLL target value in accordance with $$PLLTG = SDT \times k$$

It is to be noted that, as the counting operation in this instance, it is only required to increase or decrease the PLL target value for each appropriate step value between the maximum value and the minimum value set corresponding to 750 KHz to 900 KHz which define the variation range of the CLV target value described above, and the counting operation is not limited to the processing operation in steps S304→S306 described above or in steps S305→S306 which are described below. For example, it is also possible to perform weighted calculation for each counting processing with coefficients for up counting and down counting set appropriately for the PLL target value at present.

On the other hand, if it is discriminated in step S303 that the counting mode is the down counting mode, then the coefficient k is decremented by one step of the predetermined value in step S305, whereafter the control advances to step S306, in which the output value SDT of the CLV velocity counter 33 is multiplied by the coefficient k, thereby down counting the PLL target value.

In step S307, it is discriminated whether or not the PLL target value at present is the maximum value, and if the PLL target value is the maximum value, then the control advances to step S307, in which the counting mode is changed over to the down counting mode, whereafter the control returns to step S302. On the other hand, if it is discriminated that the PLL target value does not reach the maximum value, then the control advances to step S308, in which it is discriminated whether or not PLL target value reaches the minimum value. In here, if it is discriminated that the PLL target value reaches the minimum value, then the control advances to step S309, in which changing over to the up counting mode is performed, whereafter the control returns to step S302. On the other hand, if a negative result is obtained in step S308, then the control returns to step S302 while the counting mode till then is maintained. In this manner, whereas, in the CLV scanning mode in the wild mode, the CLV target value is fixed, since the PLL target value is varied to perform scanning, it is possible, for example, for the VCO 44 to enter at a high speed into a condition wherein it can be locked to the output value SDT of the CLV velocity counter 33.

It is to be noted that, also in this instance, it is possible for changing over between the up counting mode and the down counting mode for the coefficient k to be performed based on a result of measurement of the EFM pit length similarly as upon sweeping of the CLV target value described hereinabove.

Since the lock range and the capture range of the PLL circuit in the wide mode are expanded in such a manner as described above, while the shock proof strength against a rotational disturbance is ±4 frames in a related art system, where the CD player of the present embodiment uses a DRAM of 4 Megabytes as a buffer memory for the RAM 9, in the wide mode, the shock proof strength is ±35,000 EFM frames. Thus, as long as the locked condition of the PLL circuit is not lost, the CD player has a strength as high as 9,000 times that of the related art system. Then, while the limit at which the locked condition of the PLL circuit is lost in the related art is a lock range of approximately ±1 MHz, in the present embodiment, a lock range of approximately ±7 MHz is obtained. Accordingly, the CD player of the present embodiment can bear disturbance strength as high as seven times that of the related art system.

Further, in the present embodiment, a frequency signal based on the signal PLCK obtained by ½ division of the oscillation frequency of the VCO 44 is used as a clock for the processing in the signal processing circuit 7. From this, not only the EFM decoding circuit 22 but also the error correction/de-interleave processing circuit 23 are operated with the signal PLCK. It is to be noted that time-base correction of data is performed by write and read control for the RAM 9 by the memory controller 8.

Consequently, the frame jitter margin upon error correction is not required. As a result, even with a minimum system construction in which the RAM 24 having a capacity of, for example, approximately 26 Kilobits is used, a PLL/CLV servo circuit can be designed without taking a frame jitter margin into consideration. In short, the CLV servo bandwidth for which approximately 20 Hz are required in the related art can be set to approximately 1 Hz, and the power consumption of the CLV servo circuit system can be reduced as much.

2-f. Variable Velocity Reproduction Operation

While, in the foregoing description, it is presumed that the CLV target value outputted from the CLV target setting circuit 35 in the wide mode is a fixed value corresponding to the required CLV velocity, in the present embodiment, it is possible to perform a variable velocity reproduction operation by varying the CLV target value to be outputted from the CLV target setting circuit 35 in a condition wherein the PLL circuit system 25B is performing the operation in the wide mode described above.

In short, the PLL circuit system 25B varies the CLV target value of the CLV target setting circuit 35 to a value corresponding to the required CLV velocity in a condition (locked condition) wherein the lock range is expanded by the operation in the wide mode described above.

Since it is secured that the lock range obtained by the operation of the wide mode of the present embodiment remains in the range which depends upon the characteristics of the D/A converter 49 and adder 43 and the frequency variation range of the VCO 44, if the PLL circuit system 25B is in a wide locked condition as a result of operation in the wide mode, then even if the CLV target value of the CLV target setting circuit 35 is varied and set, the CLV servo circuit system 25A converges so that the CLV velocity corresponding to the changed object CLV target value may be obtained while the locked condition of the PLL circuit system 25B is maintained, thereby obtaining a condition wherein a signal can be read. In short, during signal reading, the reproduction rate can be varied without stopping the reading operation.

However, if high volume of the variation step size is taken for the CLV target to bring it to the object value, when this exceeds the lock range of the analog PCO circuit 41, then the locked condition of the PLL circuit system 25B is lost. Therefore, the variation step size for the CLV target value must be set so that the locked condition may not be lost. In the present embodiment, while a maximum step side of 25 percent is obtained theoretically, a result that the maximum step size may be 2 percent or less per one step for practical use was obtained. Further, the variation time interval between steps may be set so that the follow-up speed of the disk rotational speed control of the CLV servo circuit system 25A or the signal GFS inputted from the synchronism detection circuit 26 may not drop.

For example, in the case of a CD, an audio reproduction signal obtained by variable velocity reproduction has a pitch (pitch of sound) and a reproduction rate which are varied by a ratio of variation from the reference rate. Accordingly, for example, a reproduction signal obtained by variable velocity reproduction can be utilized for a key transpose function for the karaoke or the like. However, where the reproduction signal is utilized for a key transpose function of the karaoke or the like, while, for the reproduction velocity, a reproduction velocity corresponding to reproduction at a reference velocity is required, various techniques for returning the reproduction velocity to a velocity corresponding to the reference velocity while a pitch obtained by the variable velocity reproduction is maintained have been proposed, for example, by the present applicant, and a suitable one of the techniques should be selectively adopted.

It is to be noted that the construction for realizing the operation in the wide mode described hereinabove as the embodiment above can be applied also to a reproduction apparatus which does not particularly allow setting of the wide mode only if it allows double velocity reproduction.

Further, while, in the embodiment described above, a CD player is described as a reproduction apparatus, the present invention can be applied also to, for example, a reproduction apparatus which uses another disk medium whose disk rotation control is performed in accordance with a CLV. In this instance, data to be recorded are not limited to an EFM signal. Further, naturally the present invention can be applied effectively even if a run length limited code of a different type is used.

While a preferred embodiment of the present invention has been described using specific terms, such description is for illustrative purpose only, and it is to be understood that changes and variations may be made without departing from the spirit or scope of the following claims.

What is claimed is:

1. A phase locked loop circuit, comprising:
   a reference signal generation means for generating a reference signal having a predetermined frequency;
   a first counting means for counting a frequency of an output clock of voltage controlled oscillation means based on the reference signal generated by said reference signal generation means;
   a second counting means for counting a frequency of inputted run length limited codes based on the reference signal generated by said reference signal generation means;
   a calculation means for calculating difference information between the frequency of the output clock of said voltage controlled oscillation means counted by said first counting means and the frequency of the run length limited codes counted by said second counting means;

an extraction means for extracting a phase error low frequency component between the output clock of said voltage controlled oscillation means and the inputted run length limited codes;

a change-over means for selectively changing over between the phase error low frequency component supplied from said extraction means and the difference information supplied from said calculation means;

an integration means for integrating an output of said change-over means;

a phase comparison means for performing phase comparison between the output clock of said voltage controlled oscillation means and the frequency of the inputted run length limited codes and outputting phase comparison information;

an addition means for adding an integration output of said integration means and the phase comparison information from said phase comparison means to produce an oscillation control signal and outputting the oscillation control signal to said voltage controlled oscillation means;

a lock discrimination means for discriminating whether or not a phase locked loop is locked; and a change-over control means for controlling such that, when it is discriminated by said lock discrimination means that said phase locked loop is locked, the phase error low frequency component supplied from said extraction means is selected so as to be inputted to said integration circuit, or when it is discriminated by said lock discrimination means that said phase locked loop is not locked, the difference information supplied from said calculation means is selected so as to be inputted to said integration circuit.

2. A phase locked loop circuit according to claim 1, further comprising:

a switching means for cutting the connection between said addition means and said phase comparison means so that, for a period of time when the run length limited codes are not inputted, the connection between said addition means and said phase comparison means is cut.

3. A phase locked loop circuit according to claim 1, wherein said change-over control means is a first selection means, further comprising:

a fixed value generation means for generating a fixed value; and a second selection means for selecting the frequency of the run length limited codes counted by said second counting means or the fixed value generated by said fixed value generation means, said second selection means being controlled so that, for a period of time when the run length limited codes are not inputted, the fixed value is supplied to said calculation means.

4. A phase locked loop circuit according to claim 3, further comprising:

an operation means for selecting a normal capture and lock range mode or a wide capture and lock range mode, said second selection means being controlled so that, when the normal capture and lock range mode is selected by said operation means, the fixed value is supplied to said calculation means, or when the wide capture and lock range mode is selected by said operation means, the frequency of the run length limited codes counted by said second counting means is supplied to said calculation means.

5. A phase locked loop circuit according to claim 1, wherein the run length limited codes are arranged in frame units, and wherein the second counting means outputs a signal representative of the count of the frequency of the inputted run length limited codes, further comprising:

a variable frequency range storage means for storing in advance a range between an upper limit frequency of the run length limited codes and a lower limit frequency of the run length limited codes based on an average reversal frequency of the run length limited codes which are generated for each period of the frame units;

a gain variation means for setting a variation range of a gain corresponding to the range between the upper limit frequency of the run length limited codes and the lower limit frequency of the run length limited codes stored in said variable frequency range storage means; and a variation control means for varying, based on the variation range set by said gain variation means, the gain applied to the signal representative of the count of the frequency of the run length limited codes output from said second counting means.

6. A reproduction apparatus which drives a disk type recording medium, on which run length limited codes are recorded in advance, to rotate at a constant linear velocity, comprising:

a reproduction means for reproducing the run length limited codes from the disk type recording medium;

a reference signal generation means for generating a reference signal having a predetermined frequency;

a first counting means for counting a frequency of an output clock of voltage controlled oscillation means based on the reference signal generated by said reference signal generation means;

a second counting means for counting a frequency of the run length limited codes reproduced by said reproduction means based on the reference signal generated by said reference signal generation means;

a calculation means for calculating difference information between the frequency of the output clock of said voltage controlled oscillation means counted by said first counting means and the frequency of the run length limited codes counted by said second counting means;

an extraction means for extracting a phase error low frequency component between the output clock of said voltage controlled oscillation means and the run length limited codes reproduced by said reproduction means;

a change-over means for selectively changing over between the phase error low frequency component supplied from said extraction means and the difference information supplied from said calculation means;

an integration means for integrating an output of said change-over means;

a phase comparison means for performing phase comparison between the output clock of said voltage controlled oscillation means and the frequency of the run length limited codes reproduced by said reproduction means and outputting phase comparison information;

an addition means for adding an integration output of said integration means and the phase comparison information from said phase comparison means to produce an oscillation control signal and outputting the oscillation control signal to said voltage controlled oscillation means;

a lock discrimination means for discriminating whether or not a phase locked loop is locked; and a change-over control means for controlling such that, when it is discriminated by said lock discrimination means that said phase locked loop is locked, the phase error low frequency component supplied from said extraction means is selected so as to be inputted to said integration circuit, or when it is discriminated by said lock discrimination means that said phase locked loop is not locked, the difference information supplied from said calculation means is selected so as to be inputted to said integration circuit.

7. A reproduction apparatus according to claim 6, further comprising:

a switching means for cutting the connection between said addition means and said phase comparison means so that, for a period of time when the run length limited codes are not inputted, the connection between said addition means and said phase comparison means is cut.

8. A reproduction apparatus according to claim 6, wherein said change-over control means is a first selection means, further comprising:

a fixed value generation means for generating a fixed value; and a second selection means for selecting the frequency of the run length limited codes counted by said second counting means or the fixed value generated by said fixed value generation means, said second selection means being controlled so that, for a period of time when the run length limited codes are not inputted, the fixed value is supplied to said calculation means.

9. A reproduction apparatus according to claim 8, further comprising:

an operation means for selecting a normal capture and lock range mode or a wide capture and lock range mode, said second selection means being controlled so that, when the normal capture and lock range mode is selected by said operation means, the fixed value is supplied to said calculation means, or when the wide capture and lock range mode is selected by said operation means, the frequency of the run length limited codes counted by said second counting means is supplied to said calculation means.

10. A reproduction apparatus according to claim 6, wherein the run length limited codes are arranged in frame units, and wherein the second counting means outputs a signal representative of the count of the frequency of the inputted run length limited codes, further comprising:

a variable frequency range storage means for storing in advance a range between an upper limit frequency of the run length limited codes and a lower limit frequency of the run length limited codes based on an average reversal frequency of the run length limited codes which are generated for each period of the frame units;

a gain variation means for setting a variation range of a gain corresponding to the range between the upper limit frequency of the run length limited codes and the lower limit frequency of the run length limited codes stored in said variable frequency range storage means; and a variation control means for varying, based on the variation range set by said gain variation means, the gain applied to the signal representative of the count of the frequency of the run length limited codes output from said second counting means.

11. A phase locking method for driving a disk type recording medium, on which run length limited codes are recorded in advance, to rotate at a constant linear velocity, comprising the steps of:

counting a frequency of an output clock of a voltage controlled oscillation circuit based on a reference signal having a predetermined frequency;

counting a frequency of the run length limited codes based on the reference signal;

calculating difference information between the counted frequency of the output clock of said voltage controlled oscillation circuit and the counted frequency of the run length limited codes;

extracting a phase error low frequency component between the output clock of said voltage controlled oscillation circuit and the run length limited codes;

selecting between the extracted phase error low frequency component and the calculated difference information and integrating the selected one of the extracted phase error low frequency component and the calculated difference information;

performing phase comparison between the output clock of said voltage controlled oscillation circuit and the frequency of the run length limited codes to produce phase comparison information;

adding the integrated output signal and the phase comparison information to produce an oscillation control signal; and discriminating whether or not a phase locked loop is locked and selecting, when it is discriminated that said phase locked loop is locked, the extracted phase error low frequency component so as to be integrated by the integrating step, or selecting, when it is discriminated that said phase locked loop is not locked, the calculated difference information so as to be integrated by the integrating step.

12. A phase locking method according to claim 11, further comprising the step of:

inhibiting the adding of the phase comparison information for a period of time when the run length limited codes are not inputted.

13. A phase locking method according to claim 11, further comprising the steps of:

generating a fixed value; and selecting the counted frequency of the run length limited codes or the fixed value, so that, for a period of time when the run length limited codes are not inputted, the fixed value is used in place of the counted frequency in the step of calculating difference information.

14. A phase locking method according to claim 13, further comprising the step of:

selecting a normal capture and lock range mode or a wide capture and lock range mode, so that, when the normal capture and lock range mode is selected, the fixed value is used in place of the counted frequency in the step of calculating difference information, or when the wide capture and lock range mode is selected, the counted frequency of the run length limited codes is used in the step of calculating difference information.

15. A phase locking method according to claim 11, wherein the run length limited codes are arranged in frame units, further comprising the steps of:

storing in advance a range between an upper limit frequency of the run length limited codes and a lower limit frequency of the run length limited codes based on an average reversal frequency of the run length limited codes which are generated for each period of the frame units;

setting a variation range of a gain corresponding to the stored range between the upper limit frequency of the run length limited codes and the lower limit frequency of the run length limited codes; and varying the gain corresponding to the frequency of the run length limited codes based on the set variation range.

16. A reproduction method which drives a disk type recording medium, on which run length limited codes are recorded in advance, to rotate at a constant linear velocity, comprising the steps of:

reproducing the run length limited codes from the disk type recording medium;

generating a reference signal having a predetermined frequency;

counting a frequency of an output clock of a voltage controlled oscillator based on the reference signal;

counting a frequency of the reproduced run length limited codes based on the reference signal;

calculating difference information between the counted frequency of the output clock of said voltage controlled oscillator and the counted frequency of the run length limited codes;

extracting a phase error low frequency component between the output clock and the reproduced run length limited codes;

selectively changing over between the phase error low frequency component and the difference information;

integrating the selected one of the phase error low frequency component and the difference information;

performing phase comparison between the output clock and the frequency of the reproduced run length limited codes and outputting phase comparison information;

adding the integration and the phase comparison information to produce an oscillation control signal and outputting the oscillation control signal to said voltage controlled oscillator;

discriminating whether or not a phase locked loop is locked; and controlling the step of selectively changing over such that, when it is discriminated by said lock said phase locked loop is locked, the phase error low frequency component is selected so as to be integrated, or when it is discriminated that said phase locked loop is not locked, the difference information supplied is selected so as to be integrated.

17. A reproduction method according to claim 16, further comprising the step of:

inhibiting the adding of the phase comparison information for a period of time when the run length limited codes are not inputted.

18. A reproduction method according to claim 6, further comprising the steps of:

generating a fixed value; and selecting the counted frequency of the run length limited codes or the fixed value, so that, for a period of time when the run length limited codes are not inputted, the fixed value is used in place of the counted frequency in the step of calculating difference information.

19. A reproduction method according to claim 18, further comprising the steps of:

selecting a normal capture and lock range mode or a wide capture and lock range mode, so that, when the normal capture and lock range mode is selected, the fixed value is used in place of the counted frequency in the step of calculating difference information, or when the wide capture and lock range mode is selected, the counted frequency of the run length limited codes is used in the step of calculating difference information.

20. A reproduction method according to claim 16, wherein the run length limited codes are arranged in frame units, further comprising the steps of:

storing in advance a range between an upper limit frequency of the run length limited codes and a lower limit frequency of the run length limited codes based on an average reversal frequency of the run length limited codes which are generated for each period of the frame units;

setting a variation range of a gain corresponding to the stored range between the upper limit frequency of the run length limited codes and the lower limit frequency of the run length limited codes; and varying the gain corresponding to the frequency of the run length limited codes based on the set variation range.

21. A phase locked loop circuit, comprising:

a reference signal generator for generating a reference signal having a predetermined frequency;

a first counter for counting a frequency of an output clock of a voltage controlled oscillator based on the reference signal generated by said reference signal generator;

a second counter for counting a frequency of inputted run length limited codes based on the reference signal generated by said reference signal generator;

a calculator for calculating difference information between the frequency of the output clock of said voltage controlled oscillator counted by said first counter and the frequency of the run length limited codes counted by said second counter;

a filter for extracting a phase error low frequency component between the output clock of said voltage controlled oscillator and the inputted run length limited codes;

a switch for selectively changing over between the phase error low frequency component supplied from said filter and the difference information supplied from said calculator;

an integrator for integrating an output of said switch;

a phase comparator for performing phase comparison between the output clock of said voltage controlled oscillator and the frequency of the inputted run length limited codes and outputting phase comparison information;

an adder for adding an integration output of said integrator and the phase comparison information from said phase comparator to produce an oscillation control signal and outputting the oscillation control signal to said voltage controlled oscillator;

a lock discriminator for discriminating whether or not a phase locked loop is locked; and a switch controller for controlling such that, when it is discriminated by said lock discriminator that said phase locked loop is locked, the phase error low frequency component supplied from said filter is selected so as to be inputted to said integration circuit, or when it is discriminated by said lock discriminator that said phase locked loop is not locked, the difference information supplied from said calculator is selected so as to be inputted to said integration circuit.

22. A phase locked loop circuit according to claim 21, wherein said switch is a first switch, further comprising:

a second switch for cutting the connection between said adder and said phase comparator so that, for a period of time when the run length limited codes are not inputted, the connection between said adder and said phase comparator is cut.

23. A phase locked loop circuit according to claim 21, wherein said switch is a first selector, further comprising:

a fixed value generator for generating a fixed value; and a second selector for selecting the frequency of the run length limited codes counted by said second counter or the fixed value generated by said fixed value generator, said second selector being controlled so that, for a period of time when the run length limited codes are not inputted, the fixed value is supplied to said calculator.

24. A phase locked loop circuit according to claim 23, further comprising:

an operation means for selecting a normal capture and lock range mode or a wide capture and lock range mode, said second selector being controlled so that, when the normal capture and lock range mode is selected by said operation means, the fixed value is supplied to said calculator, or when the wide capture and lock range mode is selected by said operator, the frequency of the run length limited codes counted by said second counter is supplied to said calculator.

25. A phase locked loop circuit according to claim 21, wherein the run length limited codes are arranged in frame units, and wherein the second counter outputs a signal representative of the count of the frequency of the inputted run length limited codes, further comprising:

a variable frequency range memory for storing in advance a range between an upper limit frequency of the run length limited codes and a lower limit frequency of the run length limited codes based on an average reversal frequency of the run length limited codes which are generated for each period of the frame units;

a variation range circuit for setting a variation range of a gain corresponding to the range between the upper limit frequency of the run length limited codes and the lower limit frequency of the run length limited codes stored in said variable frequency range memory; and a variation control circuit for varying, based on the variation range set by said variation range circuit, the gain applied to the signal representative of the count of the frequency of the run length limited codes output from said second counter.

26. A reproduction apparatus which drives a disk type recording medium, on which run length limited codes are recorded in advance, to rotate at a constant linear velocity, comprising:

a reproducer for reproducing the run length limited codes from the disk type recording medium;

a reference signal generator for generating a reference signal having a predetermined frequency;

a first counter for counting a frequency of an output clock of a voltage controlled oscillator based on the reference signal generated by said reference signal generator;

a second counter for counting a frequency of the run length limited codes reproduced by said reproducer based on the reference signal generated by said reference signal generator;

a calculator for calculating difference information between the frequency of the output clock of said voltage controlled oscillator counted by said first counter and the frequency of the run length limited codes counted by said second counter;

a filter for extracting a phase error low frequency component between the output clock of said voltage controlled oscillator and the run length limited codes reproduced by said reproducer;

a switch for selectively changing over between the phase error low frequency component supplied from said filter and the difference information supplied from said calculator;

an integrator for integrating an output of said switch;

a phase comparator for performing phase comparison between the output clock of said voltage controlled oscillator and the frequency of the run length limited codes reproduced by said reproducer and outputting phase comparison information;

an adder for adding an integration output of said integrator and the phase comparison information from said phase comparator to produce an oscillation control signal and outputting the oscillation control signal to said voltage controlled oscillator;

a lock discriminator for discriminating whether or not a phase locked loop is locked; and a switch controller for controlling such that, when it is discriminated by said lock discriminator that said phase locked loop is locked, the phase error low frequency component supplied from said filter is selected so as to be inputted to said integration circuit, or when it is discriminated by said lock discriminator that said phase locked loop is not locked, the difference information supplied from said calculator is selected so as to be inputted to said integration circuit.

27. A reproduction apparatus according to claim 26, wherein said switch is a first switch, further comprising:

a second switch for cutting the connection between said adder and said phase comparator so that, for a period of time when the run length limited codes are not inputted, the connection between said adder and said phase comparator is cut.

28. A reproduction apparatus according to claim 26, wherein said switch is a first selector, further comprising:

a fixed value generator for generating a fixed value; and a second selector for selecting the frequency of the run length limited codes counted by said second counter or the fixed value generated by said fixed value generator, said second selector being controlled so that, for a period of time when the run length limited codes are not inputted, the fixed value is supplied to said calculator.

29. A reproduction apparatus according to claim 28, further comprising:

an operation means for selecting a normal capture and lock range mode or a wide capture and lock range mode, said second selector being controlled so that, when the normal capture and lock range mode is selected by said operation means, the fixed value is supplied to said calculator, or when the wide capture and lock range mode is selected by said operation means, the frequency of the run length limited codes counted by said second counter is supplied to said calculator.

30. A reproduction apparatus according to claim 26, wherein the run length limited codes are arranged in frame units, and wherein the second counter outputs a signal representative of the count of the frequency of the inputted run length limited codes, further comprising:

a variable frequency range memory for storing in advance a range between an upper limit frequency of the run length limited codes and a lower limit frequency of the run length limited codes based on an average reversal frequency of the run length limited codes which are generated for each period of the frame units;

a variation range circuit for setting a variation range of a gain corresponding to the range between the upper limit frequency of the run length limited codes and the lower limit frequency of the run length limited codes stored in said variable frequency range memory; and a variation control circuit for varying, based on the variation range set by said variation range circuit, the gain applied to the signal representative of the count of the frequency of the run length limited codes output from said second counter.

* * * * *